US009761606B1

(12) United States Patent
Ishida et al.

(10) Patent No.: US 9,761,606 B1
(45) Date of Patent: Sep. 12, 2017

(54) STACKED NON-VOLATILE SEMICONDUCTOR MEMORY DEVICE WITH BURIED SOURCE LINE AND METHOD OF MANUFACTURE

(71) Applicant: TOSHIBA MEMORY CORPORATION, Minato-ku (JP)

(72) Inventors: Takashi Ishida, Yokkaichi (JP); Jun Fujiki, Mie (JP); Shinya Arai, Yokkaichi (JP); Fumitaka Arai, Yokkaichi (JP); Hideaki Aochi, Yokkaichi (JP); Kotaro Fujii, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/266,850

(22) Filed: Sep. 15, 2016

Related U.S. Application Data

(60) Provisional application No. 62/306,216, filed on Mar. 10, 2016.

(51) Int. Cl.
| | | |
|---|---|---|
| *H01L 27/115* | (2017.01) | |
| *H01L 27/11582* | (2017.01) | |
| *H01L 23/528* | (2006.01) | |
| *H01L 23/522* | (2006.01) | |

(Continued)

(52) U.S. Cl.
CPC .... *H01L 27/11582* (2013.01); *H01L 23/5226* (2013.01); *H01L 23/5283* (2013.01); *H01L 27/11556* (2013.01); *H01L 27/11578* (2013.01)

(58) Field of Classification Search
CPC ......... H01L 27/11578; H01L 27/11582; H01L 27/11556
See application file for complete search history.

(56) References Cited

U.S. PATENT DOCUMENTS

| 8,278,170 B2 | 10/2012 | Lee et al. |
| 8,426,301 B2 | 4/2013 | Oh et al. |
| (Continued) | | |

FOREIGN PATENT DOCUMENTS

| JP | 2009-158529 | 7/2009 |
| JP | 2011-192879 | 9/2011 |

*Primary Examiner* — Evan Pert
(74) *Attorney, Agent, or Firm* — Oblon, McClelland, Maier & Neustadt, L.L.P.

(57) ABSTRACT

According to one embodiment, a semiconductor device includes a first interconnection, a first semiconductor region, a stacked body, a columnar portion, first insulators, and arrays. The first interconnection is provided on a substrate via a first insulating film interposed. The first semiconductor region is provided on the first interconnection via a second insulating film. The stacked body is provided on the first semiconductor region. The columnar portion is provided in the stacked body. The first insulators are provided in the stacked body. The first insulators extend in the stacking direction and a first direction crossing the stacking direction. The arrays are provided in the first semiconductor region. The arrays each include second semiconductor regions. The second semiconductor regions are separated from each other. The second semiconductor regions are provided under the first insulators. The second semiconductor regions are electrically connected to the first interconnection.

19 Claims, 19 Drawing Sheets

(51) Int. Cl.
*H01L 27/11556* (2017.01)
*H01L 27/11578* (2017.01)

(56) References Cited

U.S. PATENT DOCUMENTS

| | | | | |
|---|---|---|---|---|
| 2009/0294895 A1* | 12/2009 | Hofmann | .......... | H01L 27/11521 |
| | | | | 257/506 |
| 2013/0248974 A1* | 9/2013 | Alsmeier | ............... | G11C 16/04 |
| | | | | 257/321 |
| 2014/0264525 A1 | 9/2014 | Takahashi et al. | | |
| 2014/0273373 A1* | 9/2014 | Makala | ............. | H01L 27/11582 |
| | | | | 438/270 |
| 2015/0194435 A1 | 7/2015 | Lee | | |
| 2015/0294978 A1* | 10/2015 | Lu | ....................... | H01L 27/1157 |
| | | | | 438/269 |
| 2016/0204117 A1* | 7/2016 | Liu | .................... | H01L 29/66825 |
| | | | | 257/324 |
| 2016/0322368 A1* | 11/2016 | Sun | .................... | H01L 29/78391 |
| 2017/0069652 A1* | 3/2017 | Arai | .................... | H01L 27/11582 |

* cited by examiner

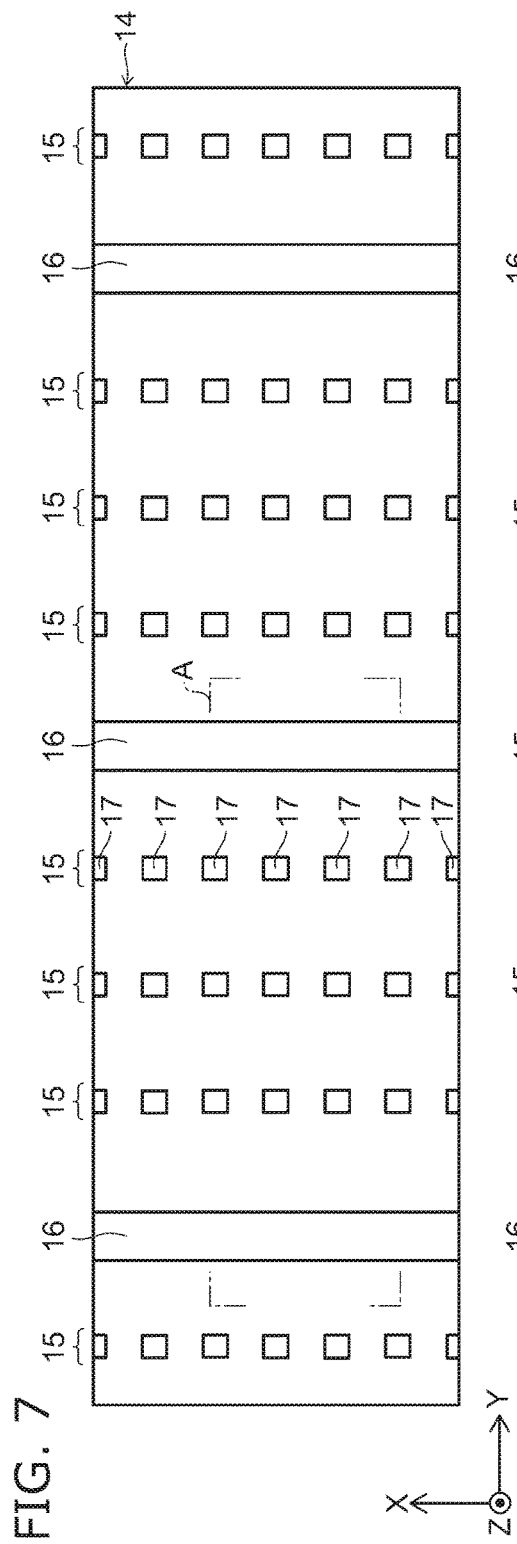
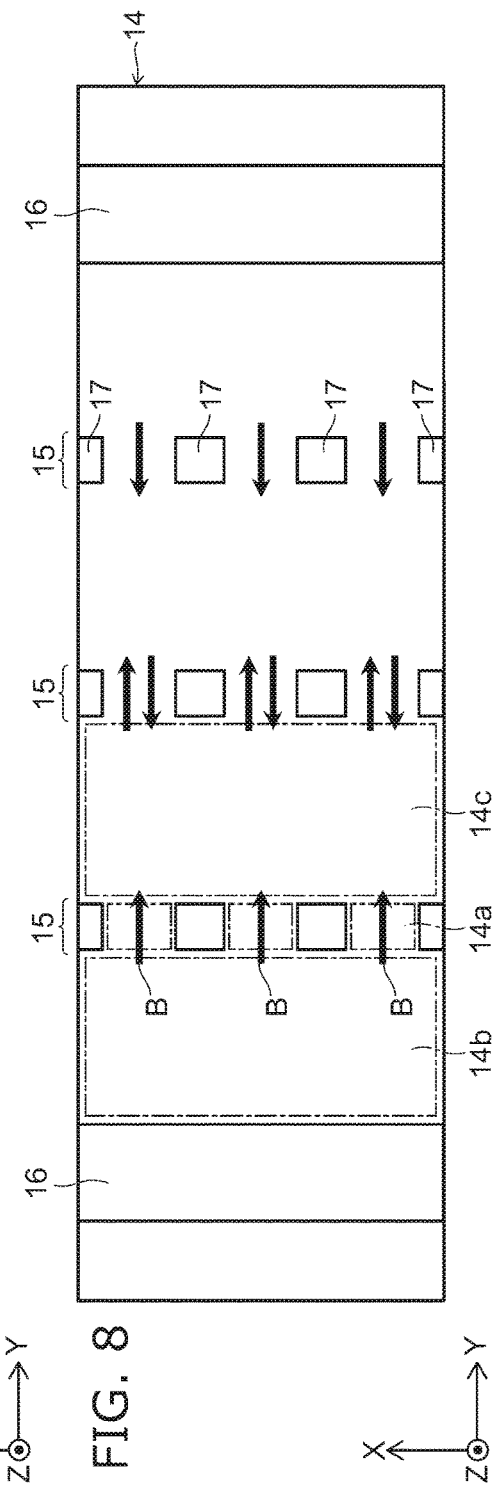

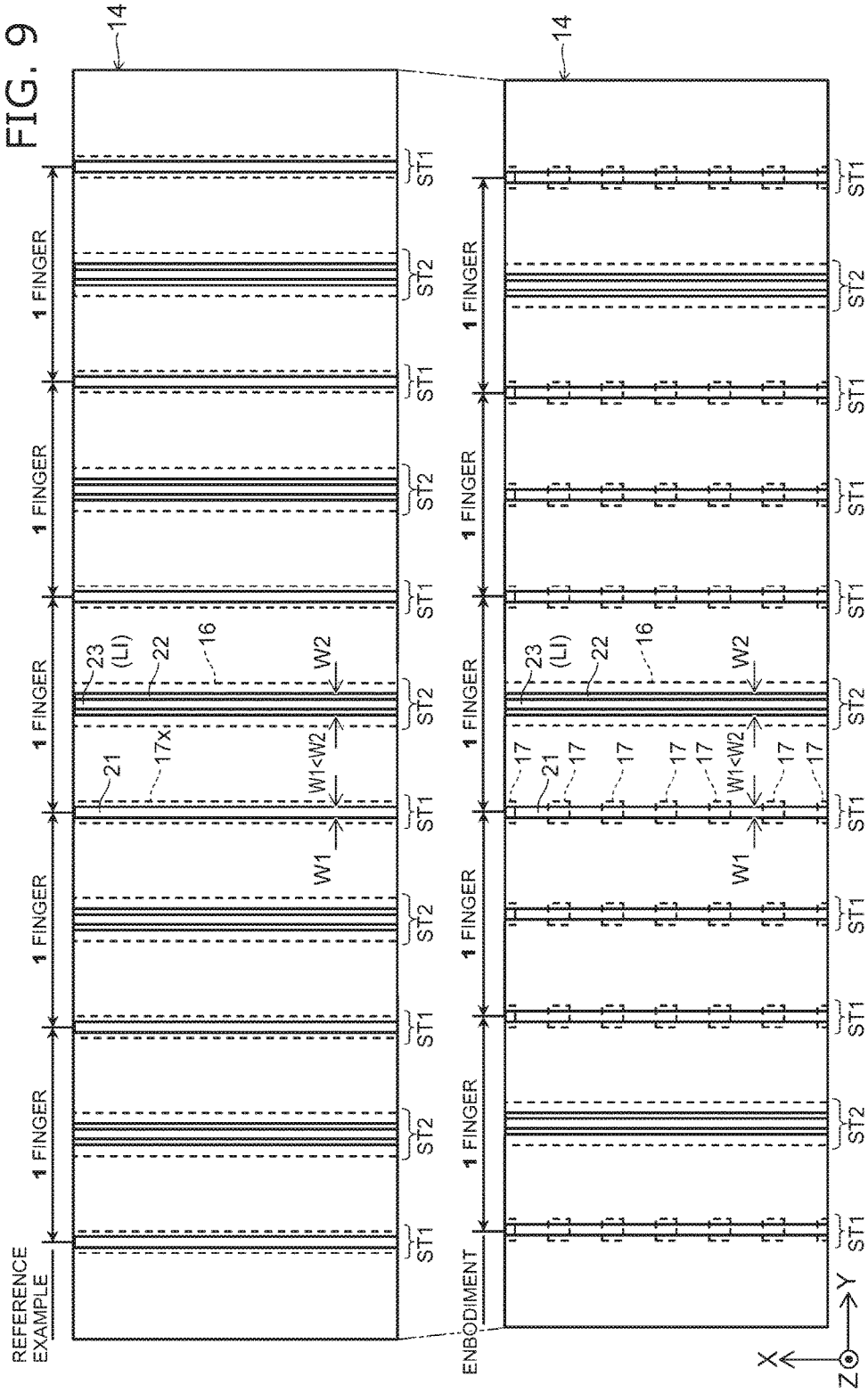

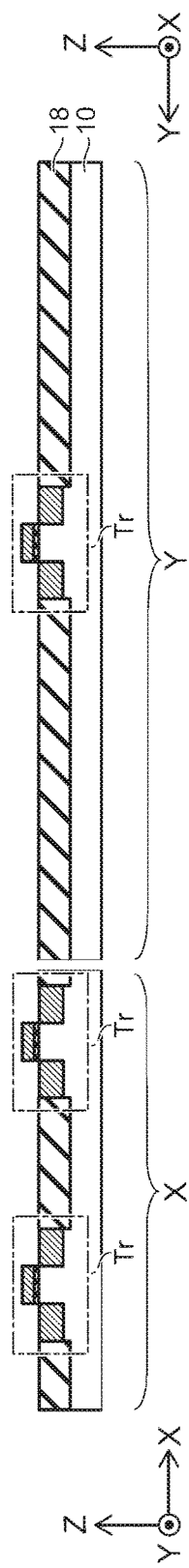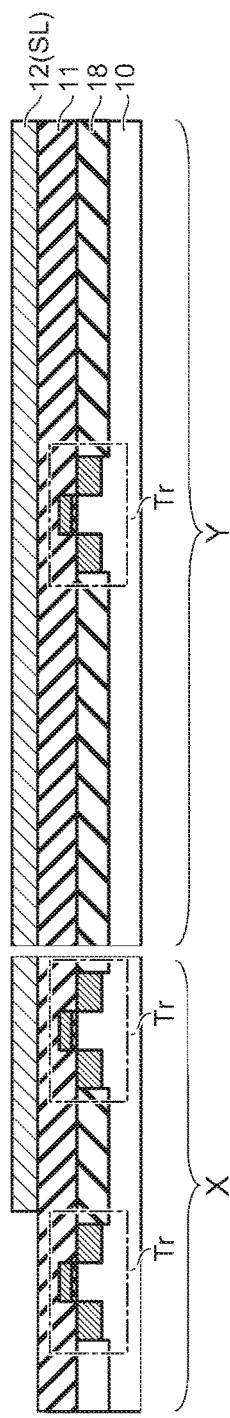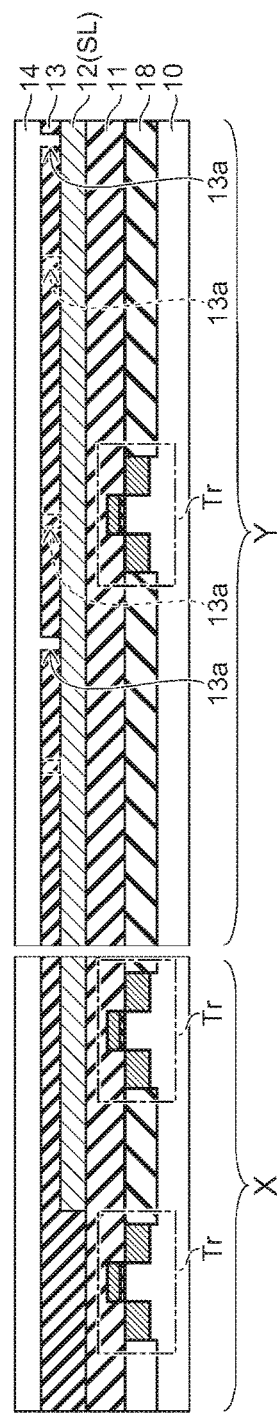
FIG. 11
FIG. 12
FIG. 13

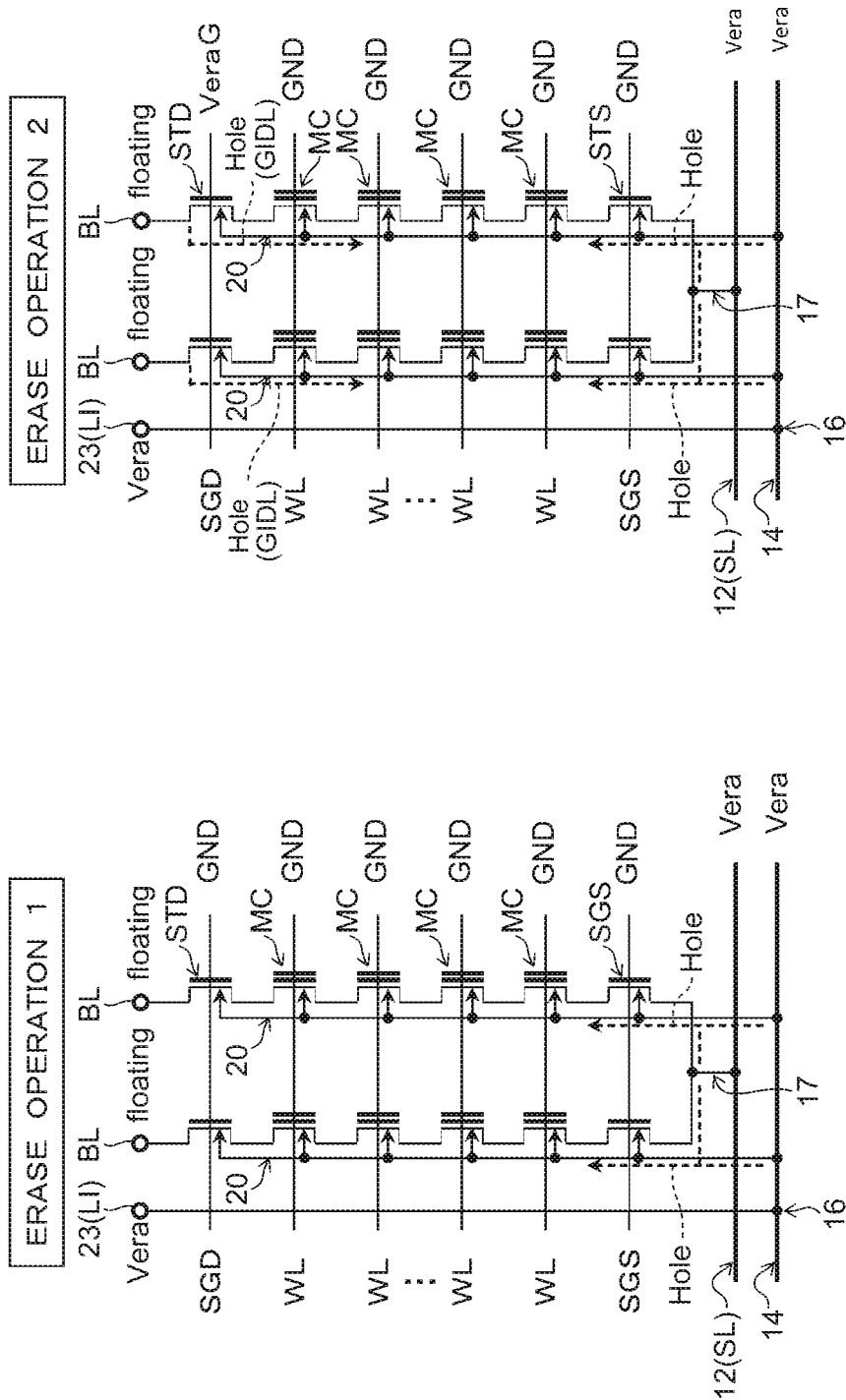

STACKED NON-VOLATILE SEMICONDUCTOR MEMORY DEVICE WITH BURIED SOURCE LINE AND METHOD OF MANUFACTURE

CROSS-REFERENCE TO RELATED APPLICATIONS

This application is based upon and claims the benefit of priority from U.S. Provisional Patent Application 62/306,216 filed on Mar. 10, 2016; the entire contents of which are incorporated herein by reference.

FIELD

Embodiments described herein relate generally to a semiconductor device and a method for manufacturing the same.

BACKGROUND

A semiconductor memory device having a three-dimensional structure has been proposed in which memory holes are made in a stacked body in which multiple electrode layers are stacked, and a charge storage film and a semiconductor film are provided to extend in the stacking direction of the stacked body inside the memory hole. The memory device includes a plurality of memory cells connected in series between a drain-side selection transistor and a source-side selection transistor. A drain of a memory cell is electrically connected via the drain-side selection transistor to a bit line. A source of the memory cell is electrically connected via the source-side selection transistor to a source line. The source line is generally provided in a slit which is formed in the stacked body. In contrast, a buried source line has been studied, which is buried under the stacked body. However, in the case where the buried source line is implemented, it is necessary to provide a local interconnection, which supplies a bias to a substrate, in every finger, for example. Thereby, the reduction of a plane size of a memory cell array is interfered. Thus, the plane size of the memory cell array is desired to be reduced, even if the buried source line is implemented.

BRIEF DESCRIPTION OF THE DRAWINGS

FIG. 7 is a schematic plan view of the first semiconductor region in the semiconductor device of the first embodiment.

FIG. 8 is a schematic plan view showing an enlarged within the frame "A" in FIG. 7.

FIG. 9 is a schematic plan view showing a reference and the first embodiment in comparison.

FIGS. 11 to 21 are schematic cross-sectional views showing a manufacturing method of the semiconductor device according to the second embodiment.

FIG. 23 is a schematic equivalent-circuit diagram showing a first example of the erasing operation according to the third embodiment.

FIG. 24 is a schematic equivalent-circuit diagram showing a second example of the erasing operation according to the third embodiment.

DETAILED DESCRIPTION

According to one embodiment, a semiconductor device includes a first interconnection, a first semiconductor region of a first conductivity type, a stacked body, a columnar portion, a plurality of first insulators, and a plurality of arrays. The first interconnection is provided on a substrate via a first insulating film interposed. The first semiconductor region of a first conductivity type is provided on the first interconnection via a second insulating film interposed. The stacked body is provided on the first semiconductor region. The stacked body includes a plurality of third insulating films and a plurality of electrode layers alternately stacked. The columnar portion is provided in the stacked body. The columnar portion extends in a stacking direction of the stacked body. The columnar portion includes a semiconductor body and a charge storage film. The semiconductor body is in contact with the first semiconductor region. The first insulators are provided in the stacked body. The first insulators extend in the stacking direction and a first direction crossing the stacking direction. The first insulators are in contact with the first semiconductor region. The arrays are provided in the first semiconductor region. The arrays each include a plurality of second semiconductor regions of a second conductivity type. The second semiconductor regions are separated from each other. The second semiconductor regions are provided under the first insulators. The second semiconductor regions are arranged in the first direction. The second semiconductor regions are electrically connected to the first interconnection.

Hereinafter, embodiments are described with reference to the drawings. It should be note that the same elements are denoted with the same numeral or symbol in each drawing. The semiconductor devices according to the embodiments are semiconductor memory devices.

First Embodiment

Figure 1:
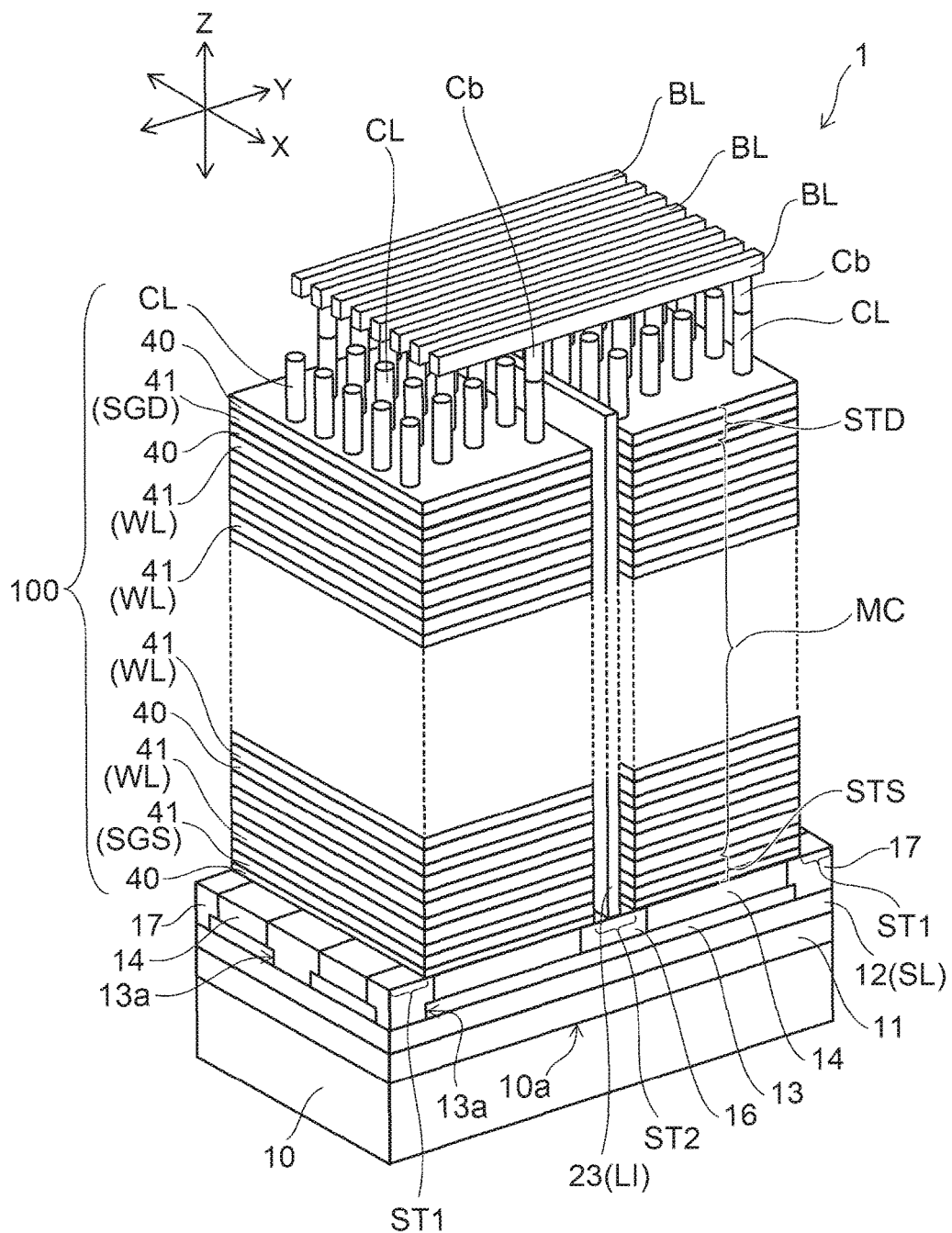
FIG. 1 is a schematic perspective view of a memory cell array in the semiconductor device of a first embodiment.

FIG. 1 is a schematic perspective view of a memory cell array 1 in the semiconductor device of a first embodiment. In FIG. 1, two mutually-orthogonal directions parallel to a major surface 10*a* of a substrate 10 are taken as an X-direction and a Y-direction. The XY plane is a plane parallel to the major surface 10*a*. A direction orthogonal to both the X-direction and the Y-direction is taken as a Z-direction (the stacking direction of a stacked body 100). In the specification, "down" refers to a direction toward the substrate 10, and "up" refers to a direction away from the substrate 10.

The memory cell array 1 includes the substrate 10 and the stacked body 100. A first insulating film 11 is provided on a major surface 10a of the substrate 10. A first interconnection 12 is provided on the first insulating film 11. A second insulating film 13 is provided on the first interconnection 12. A first semiconductor region 14 is provided on the second insulating film 13. The substrate 10 includes, for example, single crystalline silicon. Transistors (not shown) are provided in the substrate 10. The transistors are, for example, formed into a memory peripheral circuit. The first insulating film 11 and the second insulating film 13 include, for example, silicon oxide. The first interconnection 12 includes a conductor, for example, a metal or a stacked structure of metal and silicon. In the first embodiment, the first interconnection 12 is, for example, a source line SL. The source line SL provided under the first semiconductor region 14 and positioned between the first insulating film 11 and the second insulating film 13 is so-called "a buried source line". The first semiconductor region 14 includes, for example, crystallized silicon. In the first embodiment, a conductivity type of the first semiconductor region 14 is P-type.

The stacked body 100 is provided on the first semiconductor region 14. The stacked body 100 includes a plurality of third insulating films 40 and a plurality of electrode layers 41 which are alternately stacked. The electrode layers 41 includes at least one source-side selection gate (SGS), a plurality of word lines WL and at least one drain-side selection gate (SGD). The source-side selection gate (SGS) is a gate electrode of the source-side selection transistor STS. A word line is a gate electrode of a memory cell MC. The drain-side selection gate (SGD) is a gate electrode of the drain-side selection transistor STD. It should be noted that the number of electrode layers 41 stacked is arbitrary.

The source-side selection gate (SGS) is provided at a bottom portion of the stacked body 100. The drain-side selection gate (SGD) is provided at a top portion of the stacked body 100. The word lines are provided at a middle portion of the stacked body 100. In the stacked body 100, the bottom portion is defined as a portion closer to the first semiconductor region 14; the top portion is defined as a portion away from the first semiconductor region 14; and the middle portion is defined as a portion between the source-side selection gate (SGS) and the drain-side selection gate (SGD). For example, at least one of the electrode layers 41, which includes the electrode layer 41 closest to the semiconductor region 14, acts as the source-side selection gate SGS. At least one of the electrode layers 41, which includes the electrode layer 41 furthest away from the semiconductor region 14, acts as the drain-side selection gate (SGD).

The columnar portion CL, a first slit ST1 and a second slit ST2 are provided in the stacked body 100. The columnar portion CL extends in the stacking direction (hereinafter, explained as the Z-direction). The first slit ST1 extends in the Z-direction and the X-direction crossing the Z-direction, for example, orthogonal to the Z-direction. As well, the second slit ST2 also extends in the Z-direction and the X-direction. One end of the columnar portion CL is electrically connected through a contact portion Cb to the bit line BL. The bit line BL is provided above the stacked body 100. The bit line BL extends in the Y-direction crossing the X-direction, for example, orthogonal to the X-direction.

Figure 2:
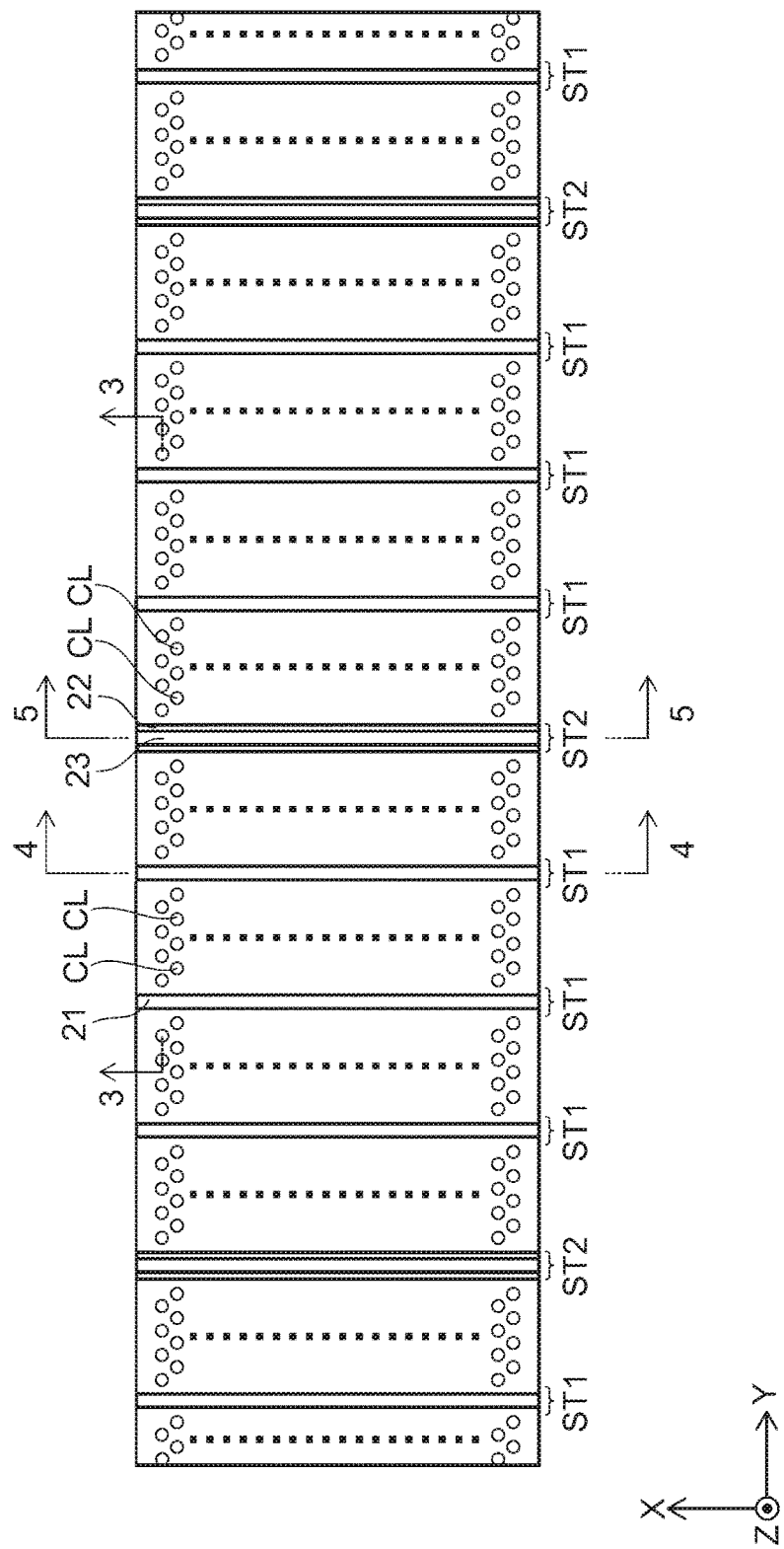
FIG. 2 is a schematic plan view of the memory cell array in the semiconductor device of the first embodiment.
Figure 3:
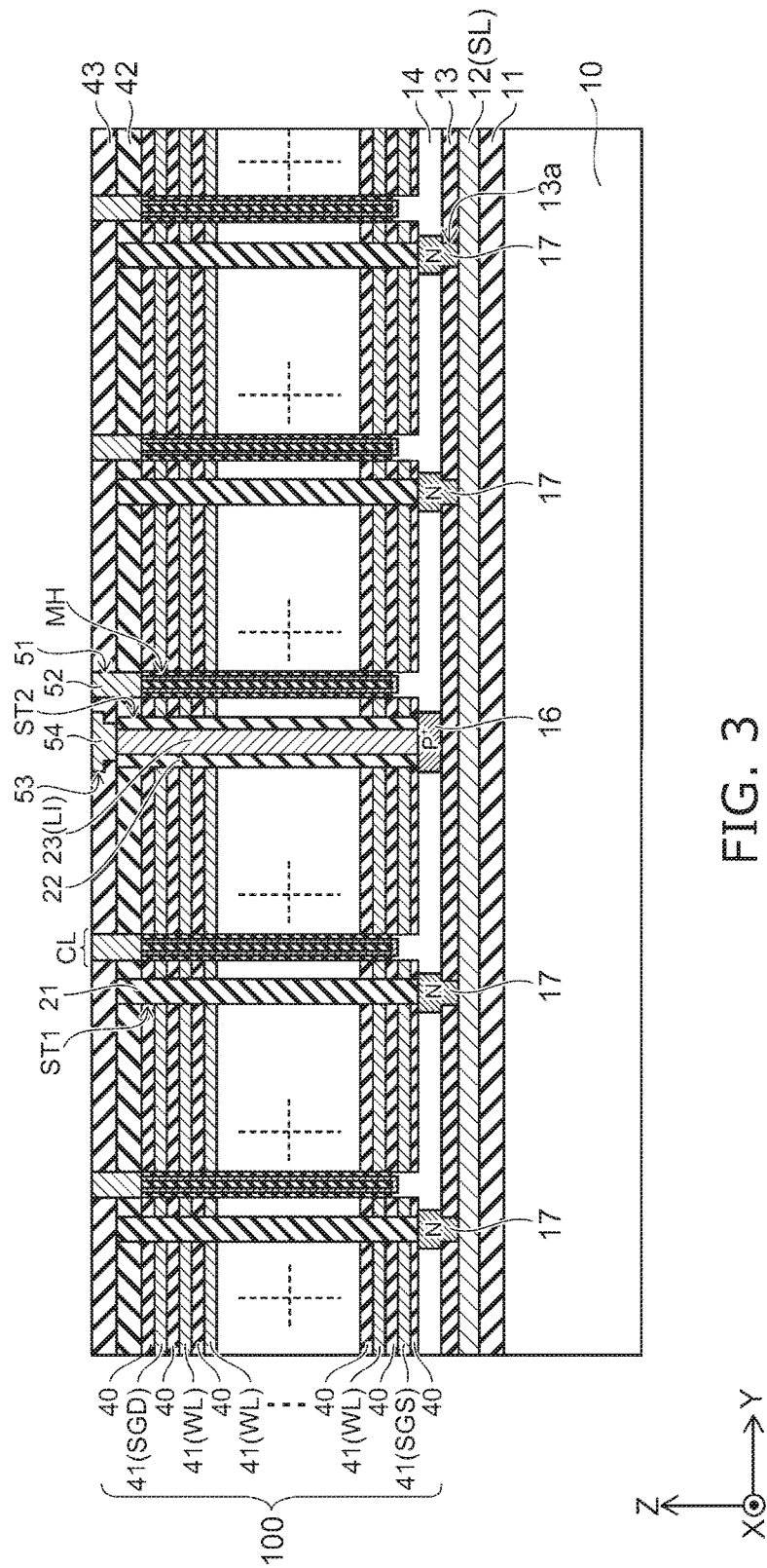
FIG. 3 is a cross-sectional view taken along 3-3 line in FIG. 2.
Figure 4:
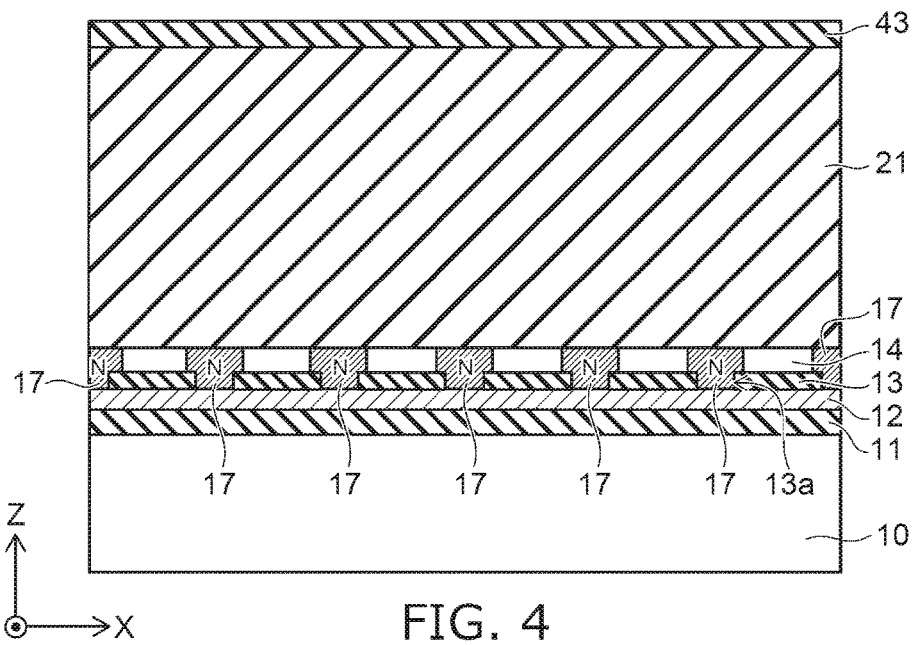
FIG. 4 is a cross-sectional view taken along 4-4 line in FIG. 2.
Figure 5:
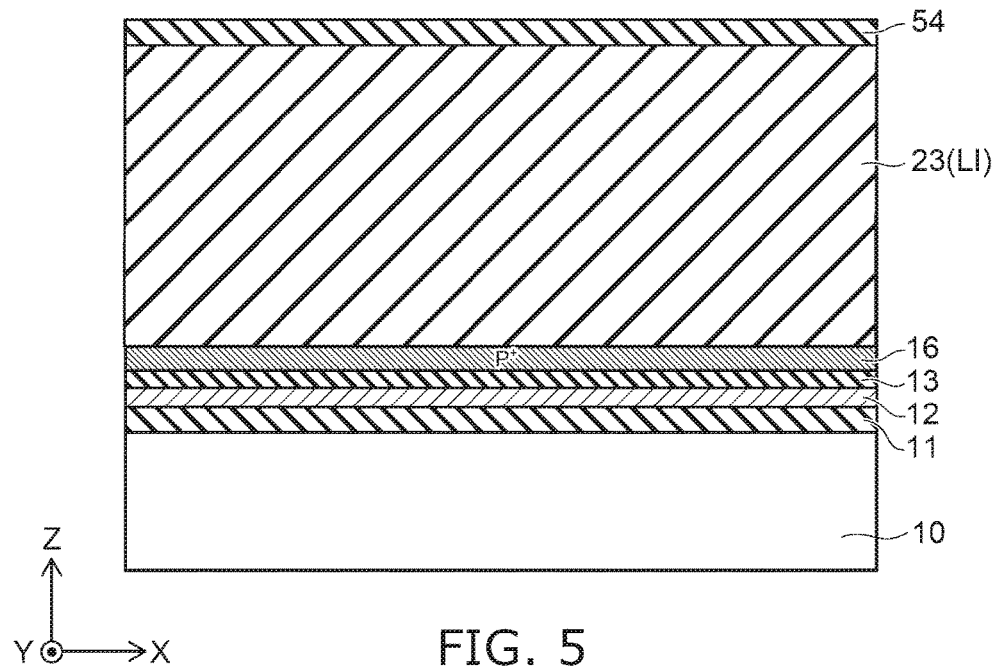
FIG. 5 is a cross-sectional view taken along 5-5 line in FIG. 2.

FIG. 2 is a schematic plan view of the memory cell array 1 in the semiconductor device of the first embodiment. FIG. 3 is a cross-sectional view taken along 3-3 line in FIG. 2. FIG. 4 is a cross-sectional view taken along 4-4 line in FIG. 2. FIG. 5 is a cross-sectional view taken along 5-5 line in FIG. 2.

As shown in FIGS. 2 and 3, the columnar portion CL includes a semiconductor body 20, a memory film 30 and a core layer 50.

Figure 6:
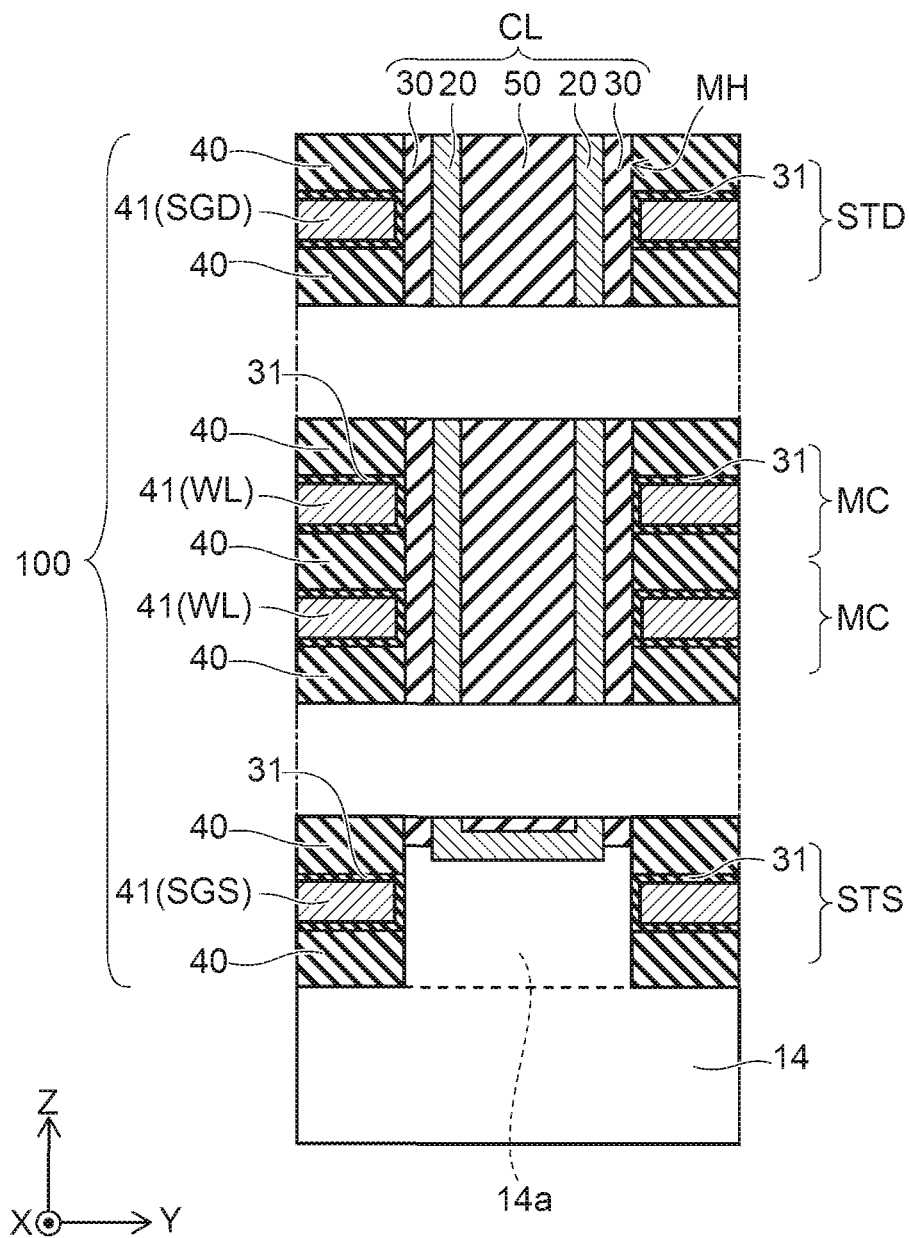
FIG. 6 is a schematic cross-sectional view showing an enlarged columnar portion.

FIG. 6 is a schematic cross-sectional view showing an enlarged columnar portion CL.

As shown in FIG. 6, a memory hole MH is provided in the stacked body 100. The memory hole MH is an opening extending in the Z-direction. The columnar portion CL is provided in the memory hole MH. The memory hole MH is formed into a shape of cylindrical shape or elliptic cylindrical shape. The memory hole MH reaches the first semiconductor region 14. In the first embodiment, for example, a semiconductor pillar 14a is provided on the bottom of the memory hole MH. The semiconductor pillar 14a is, for example, crystallized P-type silicon. The semiconductor pillar 14a is electrically connected to the first semiconductor region 14, and forms a part of the first semiconductor region 14.

The columnar portion CL includes the memory film 30, the semiconductor body 20 and the core layer 50. The memory film 30, the semiconductor body 20 and the core layer 50 are provided in the memory hole MH. The memory film 30 includes a charge storage portion in the film. The charge storage portion includes, for example, trapping sites that trap electric charges and/or a floating gate. A threshold voltage of the memory cell MC varies depending on the presence or absence of electric charges in the charge storage portion or on an amount of electric charges therein. Thereby, the memory cell MC stores information. The memory film 30 faces, for example, an electrode layer 41 through a blocking insulator film 31. Further, the memory film 30 includes a tunnel insulating film, which is omitted in the illustration, between the charge storage portion and the semiconductor body 20. A charge tunnels through the tunnel insulating film when the information is erased and programmed.

The semiconductor body 20 extends in the Z-direction. The semiconductor body 20 is, for example, crystallized P-type silicon. The semiconductor body 20 is, for example, electrically connected through the semiconductor pillar 14a to the first semiconductor region 14. The semiconductor pillar 14a faces, for example, the electrode layer 41 (SGS) through the blocking insulator film 31. It should be noted that the semiconductor pillar 14a is provided as appropriate. The core layer 50 is an insulator. The core layer 50 embeds the memory hole MH having the memory film 30 and the semiconductor body 20.

As shown in FIGS. 2 to 4, a plurality of first slits ST1 are provided in the stacked body 100. A fourth insulating film 21 is provided in a first slits ST1. The fourth insulating film 21 electrically separates electrode layers 41 along the X-direction. The fourth insulating layer 21 includes, for example, silicon oxide. The fourth insulating film 21 is, for example, in contact with the first semiconductor region 14.

As shown in FIGS. 2, 3 and 5, a plurality of second slit ST2 is provided in the stacked body 100. A fifth insulating layer 22 and a first conductor 23 is provided in a second slit ST2. The fifth insulating film 22 electrically separates electrode layer 41 along the X-direction as well as the fourth insulating layer 21. The fifth insulating layer 22 also includes, for example, silicon oxide. The first conductor 23 is provided in the fifth insulating layer 22. The first conductor 23 is electrically insulated from the stacked body 100 by the fifth insulating layer 22. The first conductor 23 extends in the Z-direction and the X-direction crossing the Z-direction, for example, orthogonal to the Z-direction. Thus, the first conductor has a wall-like shape. In the first embodiment, the first conductor 23 acts as a local interconnection LI. The local interconnection LI provides, for example, a voltage to the first semiconductor region 14.

As shown in FIGS. 3 to 5, a sixth insulating film 42 is provided on the stacked body 100. A seventh insulating film 43 is provided on the sixth insulating film 42. An opening 51 is provided in the sixth insulating film 42 and the seventh insulating film 43. A second conductor 52 is provided in the opening 51. The bottom end of the second conductor 52 is electrically connected to the semiconductor body 20; and the top end thereof is electrically connected to the contact portion Cb shown in FIG. 1. An opening 53 is further provided in the seventh insulating film 43. A third conductor 54 is provided in the opening 53. The first conductor 23 (the local interconnection LI) is electrically connected to the third conductor 54. The third conductor 54 is an interconnection which connects a plurality of first conductors 23 (local interconnections LI) arranged in the Y-direction to each other.

FIG. 7 is a schematic plan view of the first semiconductor region 14 in the semiconductor device of the first embodiment.

As shown in FIG. 7, a plurality of linear arrays of semiconductor regions 15 and a plurality of highly doped semiconductor region 16 are provided in the first semiconductor region 14. A linear array of semiconductor regions 15 and a highly doped semiconductor region 16 extend, for example, in the X-direction.

The linear array of semiconductor regions 15 includes a plurality of second semiconductor regions 17 which are separated in islands like arrangement from each other. A second semiconductor region 17 is provided in the first semiconductor region 14 under the fourth insulating film 21 (see FIGS. 3 and 4). The second semiconductor regions 17 are arrayed in the X-direction along the fourth insulating film 21; and the second semiconductor region 17 is provided along the Z-direction from the bottom end to the top end of the semiconductor region 14. A conductivity type of the second semiconductor region 17 is a conductivity type opposite to the first semiconductor region 14. In the first embodiment, that is an N-type. The second semiconductor region 17 is electrically connected to the first interconnection 12 (the source line SL), for example, via the opening 13a provided in the second insulating film 13 (see FIGS. 1 to 4). Thus, the second semiconductor region 17 acts as a source region of the source-side selection transistor STS. The inside of the opening 13a is filled with semiconductor or conductor. In the first embodiment, N-type semiconductor is embedded in the opening 13a. The N-type semiconductor is, for example, formed of the same semiconductor as the first semiconductor region 14, which is doped to be the N-type as well as the second semiconductor region 17.

A highly doped semiconductor region 16 is provided under the fifth insulating film 22 and the first conductor 23 (see FIGS. 3 and 5). The conductivity type of the highly doped semiconductor region 16 is the same as that of the first semiconductor region 14. The highly doped semiconductor region 16 includes P-type impurities, for example, boron with higher concentration thereof than that of the first semiconductor region 14. In the first embodiment, the first conductor 23 is electrically connected through the highly doped semiconductor region 16 to the first semiconductor region 14.

FIG. 8 is a schematic plan view showing an enlarged within the frame "A" in FIG. 7.

As shown in FIG. 8, the first semiconductor region 14 includes a first portion 14a, a second portion 14b and a third portion 14c. The first portion 14a is a region sandwiched between two adjacent second semiconductor regions 17 in the X-direction. In the plane of the drawing, the second portion 14b is a region spreading on a left side of the first portion 14a; and the third portion 14c is a region spreading on a right side of the first portion 14a. In the first embodiment, the second portion 14b is electrically connected through the first portion 14a to the third portion 14c. Allows B in the drawing represent charge flow, for example, hole flow supplied to the first semiconductor region 14 from the first conductor 23 (the local interconnection LI) through the highly doped semiconductor region 16.

In the semiconductor device of the first embodiment, the second semiconductor region 17 acts as the source region of the source-side selection transistor STS; and the second semiconductor region 17 are provided in the first semiconductor region 14 such that being separated from each other in the islands like arrangement. Thereby, the first semiconductor region 14 is provided so as not to be electrically divided by the second semiconductor region 17. The second portion 14b and the third portion 14c) is connected through the first portion 14a sandwiched between the two adjacent second semiconductor region 17 in the X-direction.

FIG. 9 is a schematic plan view showing a reference and the first embodiment in comparison.

As shown in FIG. 9, a second semiconductor region 17x of the reference example is provided with a linear shape extending in the X-direction. When the second semiconductor region 17x is provided along the Z-direction from the bottom end of the first semiconductor region 14 to the top end thereof, the first semiconductor region 14 is electrically divided by the second semiconductor region 17x.

A region from one second semiconductor region 17x to another second semiconductor region 17x adjacent thereto in the Y-direction is defined as "one finger". In the reference example, it is necessary to provide one highly doped semiconductor region 16 to every finger. Because supplying a bias to the first semiconductor region 14 is necessary so as not to be electrically floating potential. Thus, the first slit ST1 and the second slit ST2 are alternately disposed in the reference example. A width W2 along the Y-direction of the second slit ST2 is wider than a width W1 along the Y-direction of the first slit ST1. Because the fifth insulating film 22 and the first conductor 23 are provided in the second slit ST2.

In contrast to this, the first semiconductor region 14 is not electrically divided by the second semiconductor region 17. Thus, there is no necessity for providing the one highly doped semiconductor region 16 to every "one finger". Accordingly, it becomes possible to provide one second slit ST2 to every two more first slits ST1 as shown in FIG. 9.

For example, in the first embodiment, a first slit ST1 is provided at a position where the second slit ST is to be provided in the reference example. In this case, it is possible to provide one second slit ST2 by every three first slit ST1. The width W1 along the Y-direction of the first slit ST1 is narrower than the width W2 along the Y-direction of the second slit ST2. Accordingly, in the semiconductor device of the first embodiment, it becomes possible to reduce a width along the Y-direction of the memory cell array 1 in comparison with the reference example.

As mentioned above, according to the first embodiment, it becomes possible to reduce the in-plane size of the memory cell array 1. As a result, the semiconductor device is achieved with higher integration density.

Second Embodiment

Figure 10:
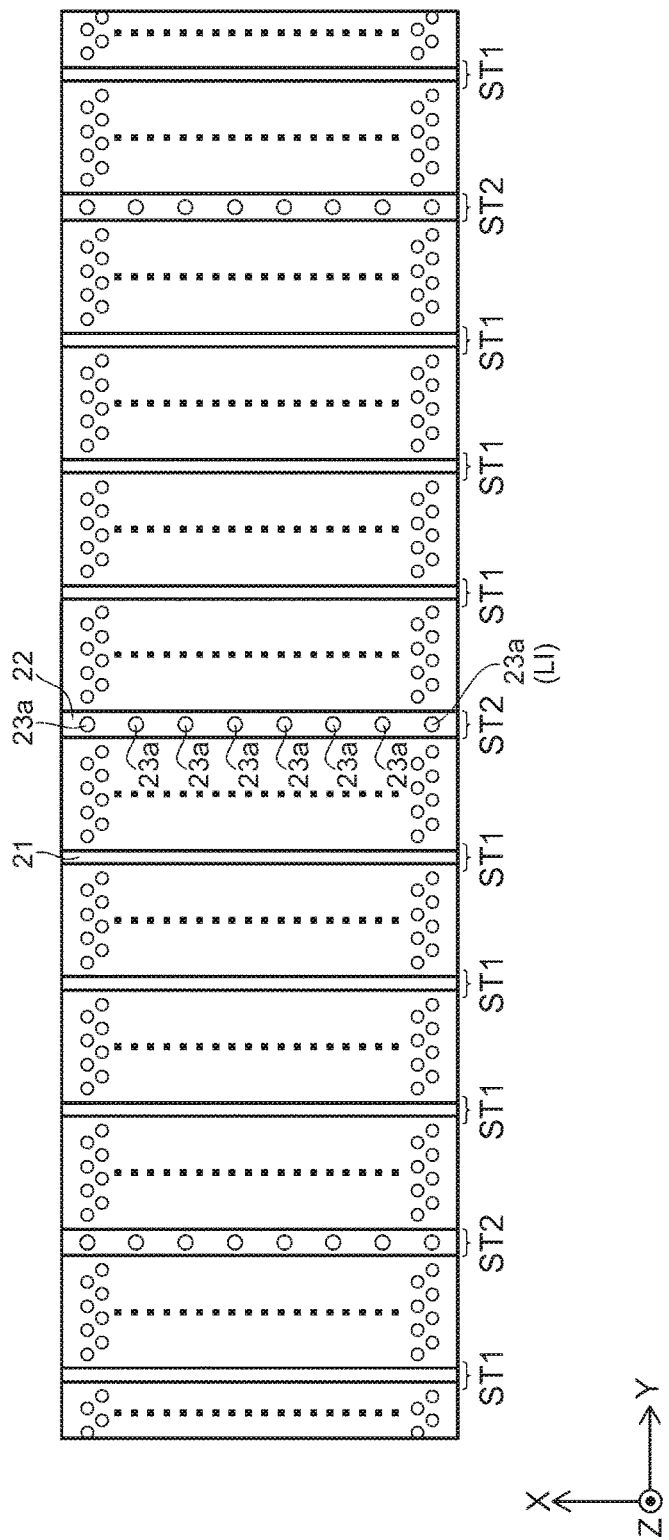
FIG. 10 is a schematic plan view of memory cell array in the semiconductor device of a second embodiment.

FIG. 10 is a schematic plan view of memory cell array 1 in the semiconductor device of a second embodiment. A plane shown in FIG. 10 corresponds to the plane shown in FIG. 2.

As shown in FIG. 10, the semiconductor device of the second embodiment is different from that of the first embodiment in a plurality of columnar conductors 23a provided in place of the wall-like first conductor 23 (the local interconnection LI). The columnar conductors 23a extend in the Z-direction, and are arranged in line along the X-direction.

Advantages in the second embodiment are in the process for simultaneously forming the columnar conductors 23a with columnar contact portions provided in the semiconductor device. Thereby, it becomes possible to achieve the advantages in the reduction of the manufacturing steps in comparison with the first embodiment, for example, by omitting the step for forming the wall-like conductor 23.

Examples of the columnar contact portions are found in staircase and peripheral portion. The staircase is provided, for example, at an end portion of the stacked body. The peripheral portion is a region around the staircase. Hereinafter, one example of the method for simultaneously forming the columnar contact portions and the columnar conductors 23a will be described.

<Manufacturing Method>

Figure 20:
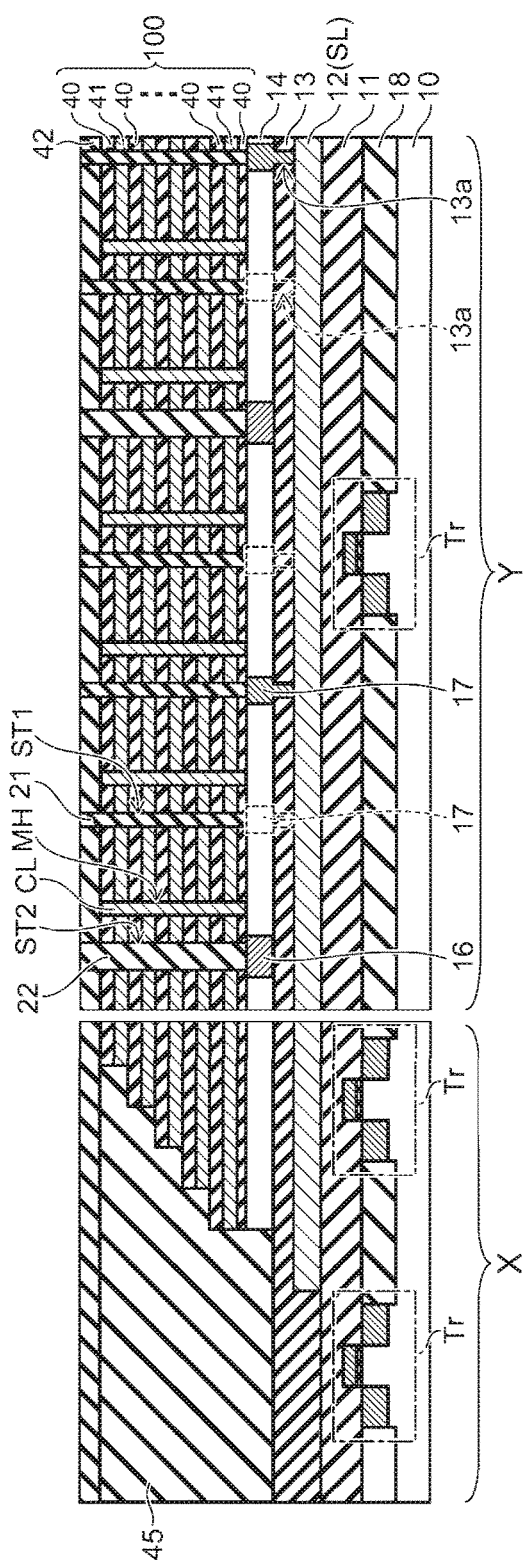
Figure 21:
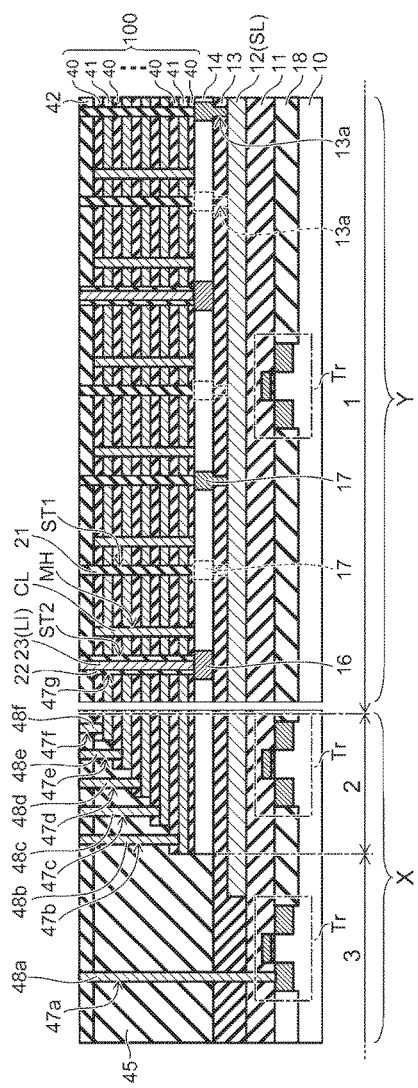
Figure 22:
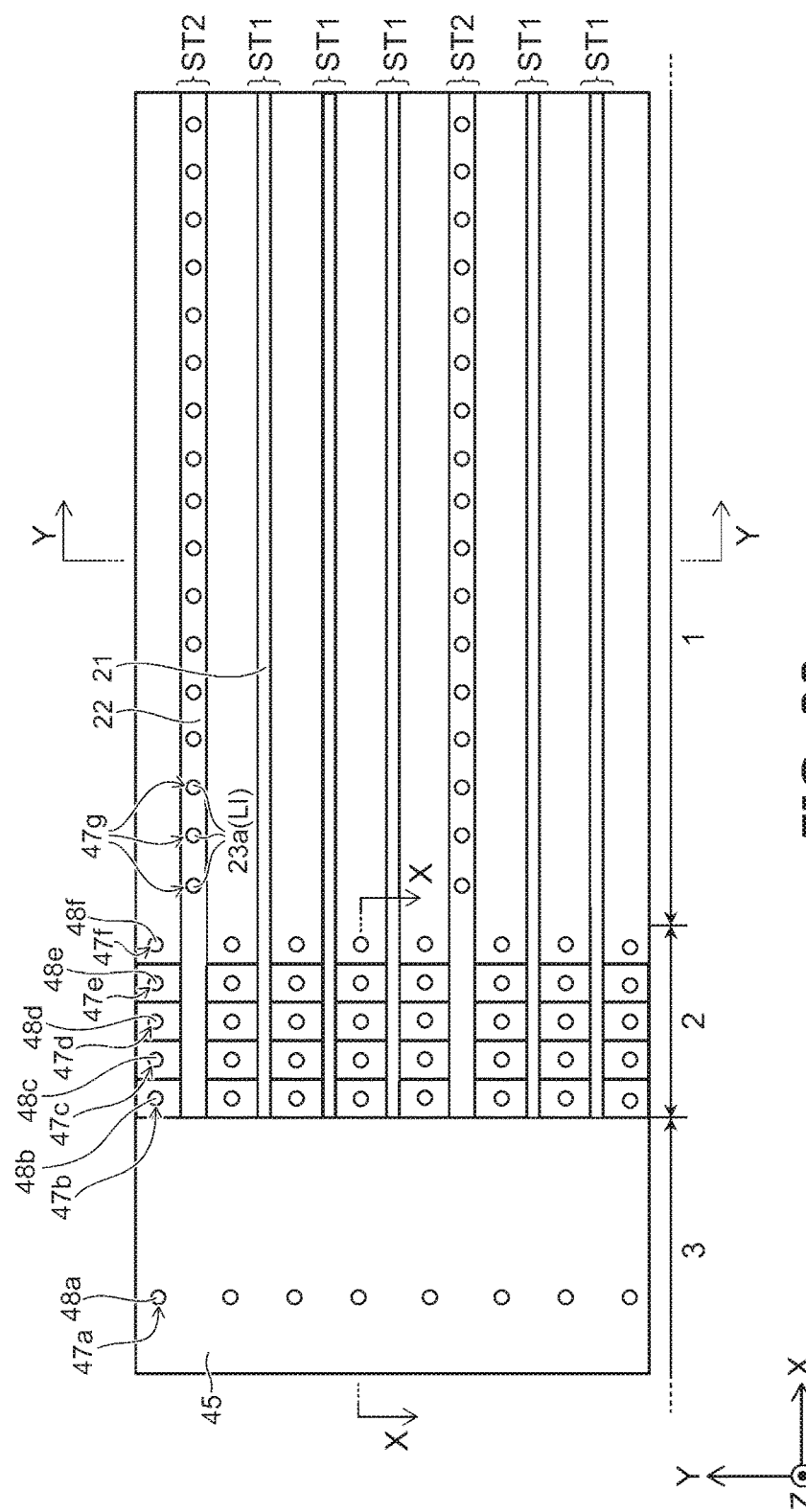
FIG. 22 is a schematic plan view of the semiconductor device according to the second embodiment.

FIGS. 11 to 21 are schematic cross-sectional views showing a manufacturing method of the semiconductor device according to the second embodiment. FIG. 22 is a schematic plan view of the semiconductor device according to the second embodiment. In FIG. 11 to 21, a cross-section denoted by a reference symbol "X" shows one taken along X-X line in FIG. 22; and another cross-section denoted by a reference symbol "Y" shows the other taken along Y-Y line in FIG. 22. The manufacturing method is described as a method for manufacturing the semiconductor device which includes transistors omitted in FIGS. 1 to 10.

1. Formation of Transistors

As shown in FIG. 11, an isolation region 18 is formed in the surface of the substrate 10. Then, a plurality of transistors Tr is formed in an element region defined by the isolation region 18 according to the well-known method. The transistors Tr are, for example, constructed the memory peripheral circuit.

2. Formation of a First Insulating Film 11 and a First Interconnection 12

As shown in FIG. 12, a first insulating film 11 is formed on the structural body shown in FIG. 10. The first insulating layer 11 is formed by the deposition of insulator, for example, including silicon oxide on the structural body shown in FIG. 10 using CVD method. Then, the first interconnection 12 is formed on the first insulating film 11. The first interconnection 12 is formed, for example, by the deposition of conductor, for example, including metal on the first insulating film 11 using CVD method. The metal is, for example, tungsten.

3. Formation of a Second Insulating Film 13 and a First Semiconductor Region 14

As shown in FIG. 13, a second insulating film 13 is formed on the first interconnection 12. The second insulating film 13 is, for example, insulator including silicon oxide. The second insulating film 13 is formed, for example, by the deposition of the insulator including silicon oxide on the first interconnection 12 using CVD method. Then, openings 13a are formed in the second insulating film 13; and the first semiconductor region 14 is formed on the second insulating film 13 in which the openings are formed.

4. Formation of a Stacked Body 100

Figure 14:
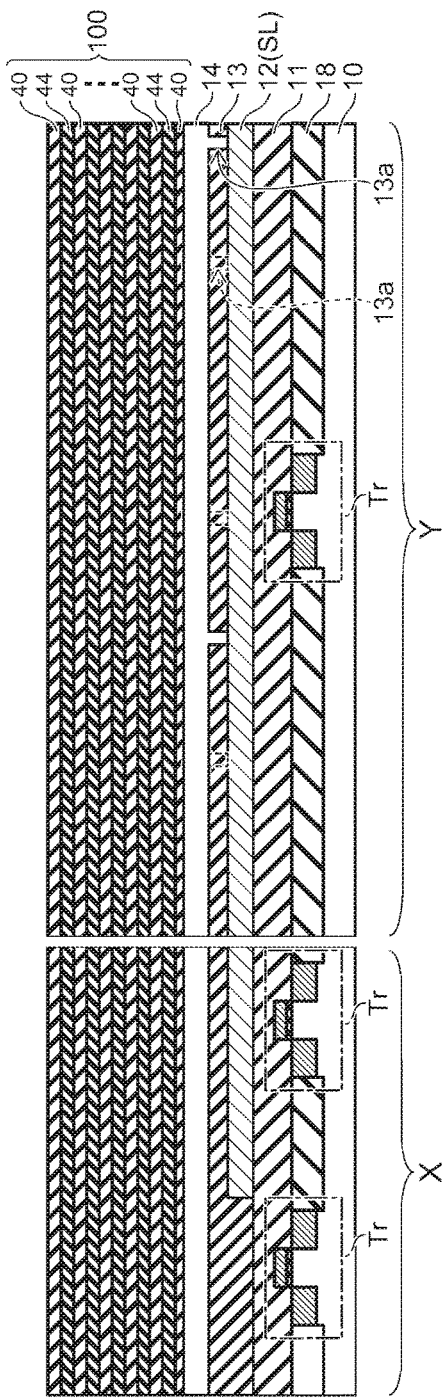

As shown in FIG. 14, a staked body 100 is formed on the first semiconductor 14. The stacked body 100 is formed by alternately stacking an insulator 40 and a sacrifice layer 44 at the step shown in FIG. 14. When the insulator 40 is silicon oxide, for example, the sacrifice layer 44 is set to be silicon nitride which is capable of attaining the prescribed etching rate ratio with respect to silicon oxide.

5. Formation of a Staircase 2

Figure 15:
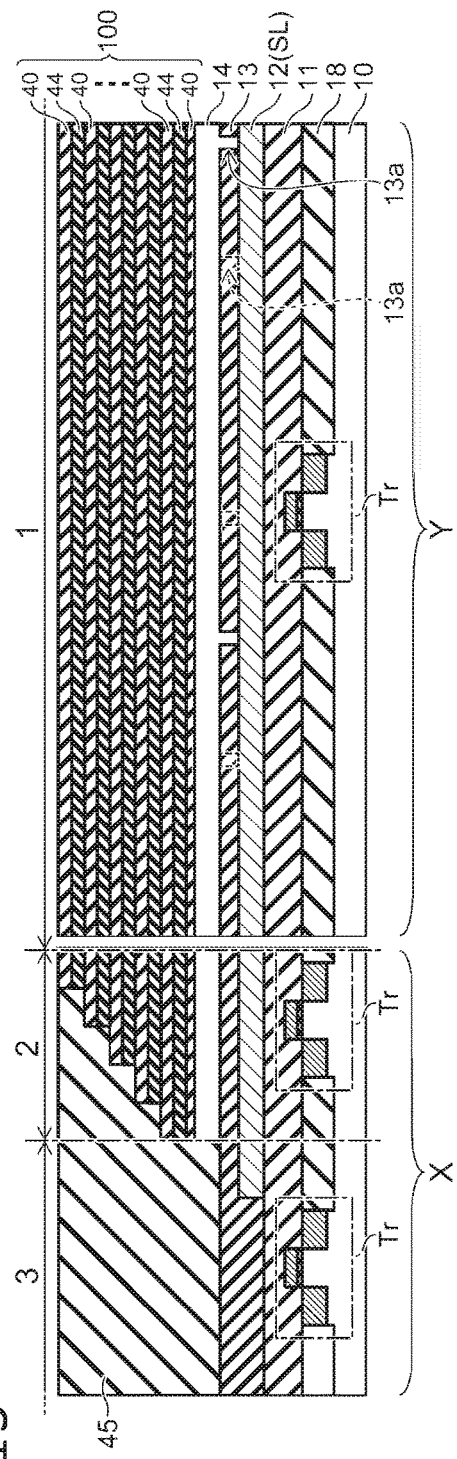

As shown in FIG. 15, a staircase 2 is formed in the end portion of the stacked body 100. In the staircase 2, a plurality of sacrifice layers 44 each formed into a stair. The staircase 2 is formed around the memory cell array 1. After the staircase 2 is formed, a peripheral region 3 is formed around the staircase 2, where the stack body 100 is not existent, for example. Although the transistors Tr are provided respectively under the memory cell array 1, the staircase 2 and the peripheral region 3 in this example, it may be enough to provide the transistors Tr at least in the peripheral region 3. Then, a recessed portion formed over the staircase 2 and the peripheral region 3 is filled with a eighth insulating film 45. The eighth insulating film 45 includes, for example, silicon oxide.

6. Formation of Columnar Portions CL

Figure 16:
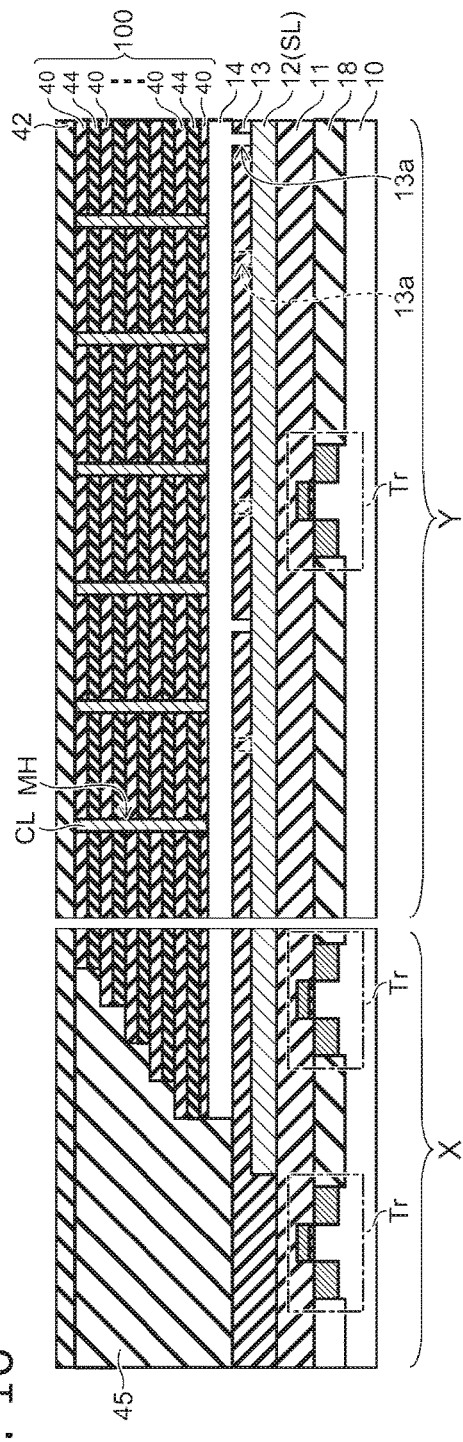

As shown in FIG. 16, columnar portions CL are formed in the stacked body 100. When forming such a columnar portion CL shown in FIG. 6, for example, the processes are carried out as described schematically as follows.

As shown in FIG. 6, a memory hole MH is formed in the stacked body 100. The memory hole MH is formed, for example, until it reaches the first semiconductor region 14. Then, a semiconductor pillar 14a is formed on the first semiconductor region 14 exposed at the bottom of the memory hole MH, for example, using CVD method. The semiconductor pillar 14a is formed on the first semiconductor region 14, for example, up to a level of an insulator 40 provided between the source-side selection gate SGS and word lines WL. Then, a memory film 30 is formed in the memory hole MH. Subsequently, the memory film 30 is etched at the bottom to expose a surface of the semiconductor pillar 14a. Then, a semiconductor body 20 is formed. Subsequently, a core layer 50 is formed to fill the memory hole MH (In FIG. 16, illustrations of memory film 30, semiconductor body 20 and the core layer 50 are omitted). Then, a sixth insulating film 42 is formed on the stacked body 100. Thus, the memory hole MH is covered with the sixth insulating film 42.

7. Formation of First Slits ST1 and Second Slits ST2

Figure 17:
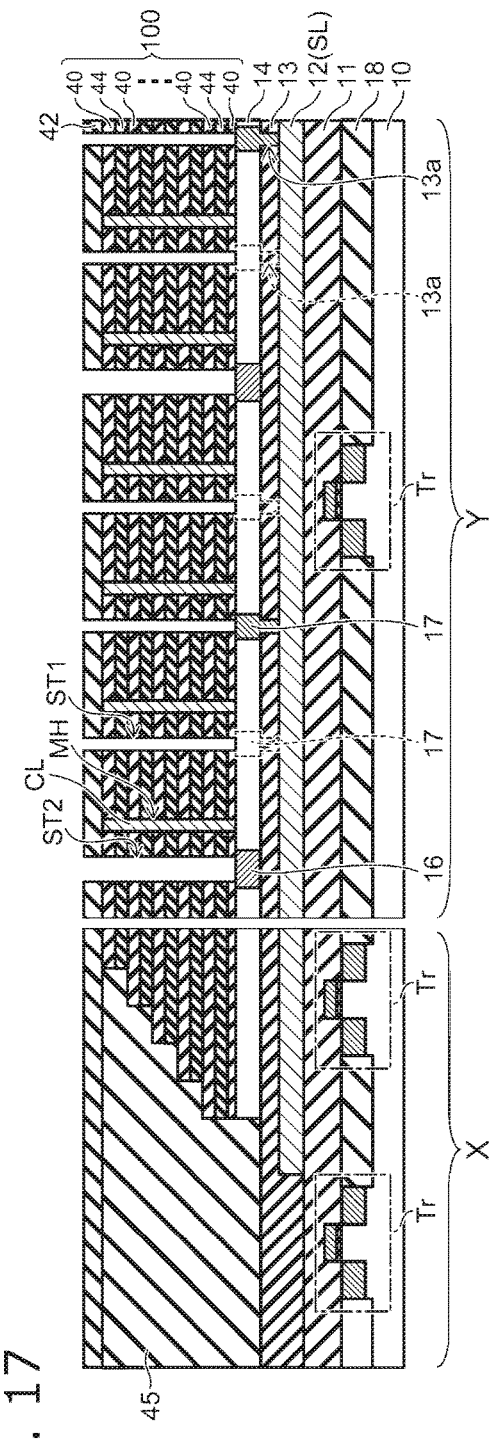

As shown in FIG. 17, first slits ST1 and second slits ST2 are formed in the stacked body 100. The first slits ST1 and the second slits are formed until they reach the semiconductor region 14.

8. Formation of Highly Doped Semiconductor Regions 16 and Second Semiconductor Regions 17

As shown in FIG. 17 as well, second semiconductor regions 17 are formed in the first semiconductor region 14 by the introduction of n-type impurities, for example, arsenic or phosphorus through the first silts ST1. Then, highly doped semiconductor regions 16 are formed in the semiconductor region 14 by the introduction of p-type impurities, for example, boron through the second slits ST2.

9. Removal of Sacrifice Layers (Formation of Electrode Layers)

Figure 18:
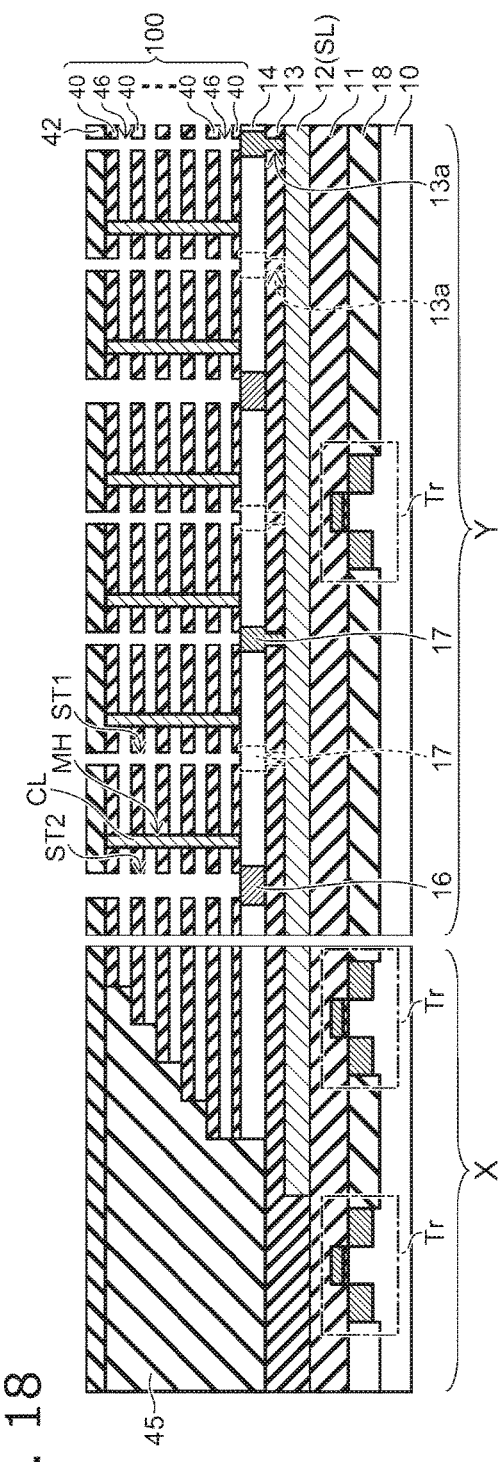

As shown in FIG. 18, sacrifice layers 44 are removed from the stacked layer 100 through the first slits ST1 and the second slits ST2. Thereby, a space 46 is provided between the insulators 40.

10. Embedment of Electrode Layers (Formation of Electrode Layers)

Figure 19:
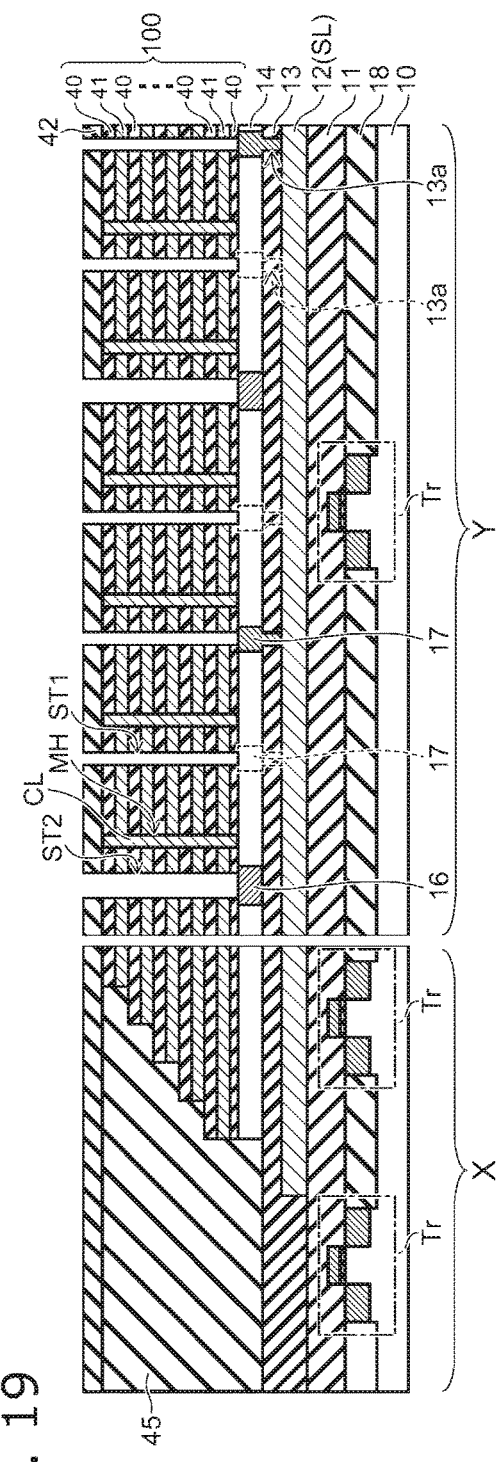

As shown in FIG. 19, blocking insulator films 31 shown in FIG. 6 is formed in spaces 46 through the first slits ST1 and the second slits ST2 (In FIG. 19, illustrations of the blocking insulator films 31 are omitted). Then, the spaces 46, in which the blocking insulator films 31 are formed, are filled with conductors. Thus, a blocking insulator film 31 and an electrode layer 41 are formed between the insulators 40.

11. Formation of a Fourth Insulating Film 21 and a Fifth Insulating Film 22

As shown in FIG. 20, a fourth insulating film 21 is formed in a first slit ST1; and a fifth insulating film 22 is formed in a second slit ST2. In this example, the fourth insulating film 21 and the fifth insulating film 22 are formed of the same insulating film. For example, an insulating film is formed by the deposition of insulator over the sixth insulating film 42 and the eighth insulating film 45. Subsequently, the insulating film is set back to form the embedded insulating films in the first slits ST1 and the second slits ST2. Thereby, the fourth insulating film 21 is formed in the first slit ST1; and the fifth insulating film 22 is formed in the second slit ST2.

12. Formation of Columnar Contact Portions 48a to 48f and Columnar Conductors 23a As shown in FIGS. 21 and 22, contact holes 47a to 47g are formed in the fifth insulating film 22, the sixth insulating film 42, the eighth insulating film 45, the first insulating film 11 and the second insulating film 13. A contact hole 47a is formed in the peripheral region 3. The contact hole 47a is formed in the sixth insulating film 42, the eighth insulating film 45, the first insulating film 11 and the second insulating film 13, and reaches, for example, the source/drain region of a transistor Tr. Contact holes 47b to 47f are formed in the staircase. The contact holes 47b to 47f are formed in the sixth insulating film 42 and the eighth insulating film 45, and reaches electrode layers 41. Contact holes 47g are formed in the memory cell array 1. The contact holes 47g are formed in the fifth insulating films 22, and reach the highly doped semiconductor regions 16.

Then, columnar contact portions 48a to 48f and columnar conductors 23a are formed in the contact holes 47a to 47g. In this example, the columnar contact portions 48a to 40f and the columnar conductors 23a are formed of the same conductive film. For example, the conductive film is formed by the deposition of conductive material on the sixth insulating film 42 and the eighth insulating film 45. Subsequently, the conductive film is set back to form the embedded conductive film in the contact holes 47a to 47g. Thus, the columnar contact portions 48a to 48f are formed in the contact holes 47a to 47f; and the columnar conductors 23a are formed in the contact holes 47g. A columnar contact portion 48a is electrically connected, for example, to the source/drain region of the transistor Tr in the peripheral region 3. Columnar contact portions 48b to 48f are electrically connected to the electrode layers 41 in the staircase 2. The columnar conductors 23a are electrically connected to the highly doped semiconductor regions 16 in the memory cell array 1.

Thereafter, although not shown specifically by a drawing, internal interconnections such as bit lines and like, and an interlayer insulating film are formed. Thereby, the semiconductor device of the second embodiment is manufactured.

The semiconductor device of the second embodiment can be formed, for example, according to the manufacturing method shown in FIGS. 11 to 22. In the manufacturing method shown in FIGS. 11 to 22, the columnar contact portions 48a to 48f and the columnar conductors 23a are simultaneously formed as shown in FIGS. 21 and 22. Thus, it is possible to reduce the manufacturing steps in comparison with the case where the columnar contact portions 48a to 48f and the columnar conductors 23a are individually formed.

Third Embodiment

The third embodiment is related to the erasing operation in the semiconductor device of the first embodiment.

<Erasing Operation 1>

FIG. 23 is a schematic equivalent-circuit diagram showing a first example of the erasing operation according to the third embodiment.

As shown in FIG. 23, when erasing information from the memory cells MC, a bias of each portion in the semiconductor device is set as follows:
  Source-side selection gate SGS: GND,
  Ward lines WL: GND,
  Drain-side selection gate SGD: GND,
  Source line SL: Vera,
  First conductor 23 (Local interconnection LI): Vera,
  First semiconductor region 14: Vera, and
  Bit line BL: Floating.

Here, GND is an internal ground bias of the circuit; and the internal ground bias of the circuit is, for example, zero volts. Vera is an erasing bias; and the erasing bias is high voltage, for example 12 to 26 volts. "Floating" represents an electrically floating state.

By setting the above bias in each portions of the semiconductor device, electric charges, for example, holes are injected into a semiconductor body 20 from a highly doped semiconductor region 16 and an n-type second semiconductor region 17. A bias in the semiconductor body of P-type, in which the holes are injected, is raised to be a positive high voltage. Since the bias of word lines WL is set to be GND, the holes are injected into charge storage portions of a charge storage film 30. Thereby, the information in the memory cells MC is erased.

As mentioned above, in the semiconductor device of the first embodiment, it is possible to erase information by the injection of holes into the semiconductor body 20 from the highly doped semiconductor region 16 and the n-type second semiconductor region 17. In the second embodiment, it is also possible to erase information by the same erasing operation.

<Erasing Operation 2>

FIG. 24 is a schematic equivalent-circuit diagram showing a second example of the erasing operation according to the third embodiment.

As shown in FIG. 24, in the second example, a bias of each portion in the semiconductor device is set as follows:
  Source-side selection gate SGS: GND,
  Word lines WL: GND,
  Drain-side selection gate SGD: VeraG,
  Source line SL: Vera,
  First conductor 23 (Local interconnection LI): Vera,
  First semiconductor region 14: Vera, and
  Bit line BL: Floating.

The erasing operation 2 is different in the bias applied to the drain-side selection gate SGD from the erasing operation 1, wherein the bias of the drain-side selection gate is changed to VeraG from GND. VeraG is an intermediate value between Vera and GND. For example, VeraG satisfies the relationship of "Vera≥VeraG≥GND".

By setting the above bias in each portions of the semiconductor device, electric charges, for example, holes are injected into the semiconductor body 20 from the highly doped semiconductor region 16 and the n-type second semiconductor region 17 as well as the erasing operation 1. In addition to this hole injection, a gate induced drain leakage (GIDL) is further induced from the drain of the drain-side selection gate transistor STD. Holes due to the GIDL is further injected into the semiconductor body 20. As a result, the hole injection due to the GIDL is induced in addition to the hole injection from the highly doped semiconductor region 16 and the n-type second semiconductor region 17 into the semiconductor body 20. Thereby, the hole injection into the semiconductor body 20 is further increased in comparison with the erasing operation 1. Thus, it is possible to raise the bias more rapidly to the positive high voltage in the semiconductor body 20 of P-type, in which the holes are injected, in comparison with the erasing operation 1. As a result, it is possible to achieve the high-speed erasing operation, for example.

As mentioned above, in the semiconductor devices of the first and second embodiments, it is possible to concurrently use the hole injection into the semiconductor body 20 from the highly doped semiconductor region 16 and the n-type second semiconductor region 17 and the hole injection due to the GIDL at the drain-side selection transistor STD.

In the erasing operation 2, further high-speed operation of erasing is achieved in comparison with the erasing operation 1.

Fourth Embodiment

Figure 25:
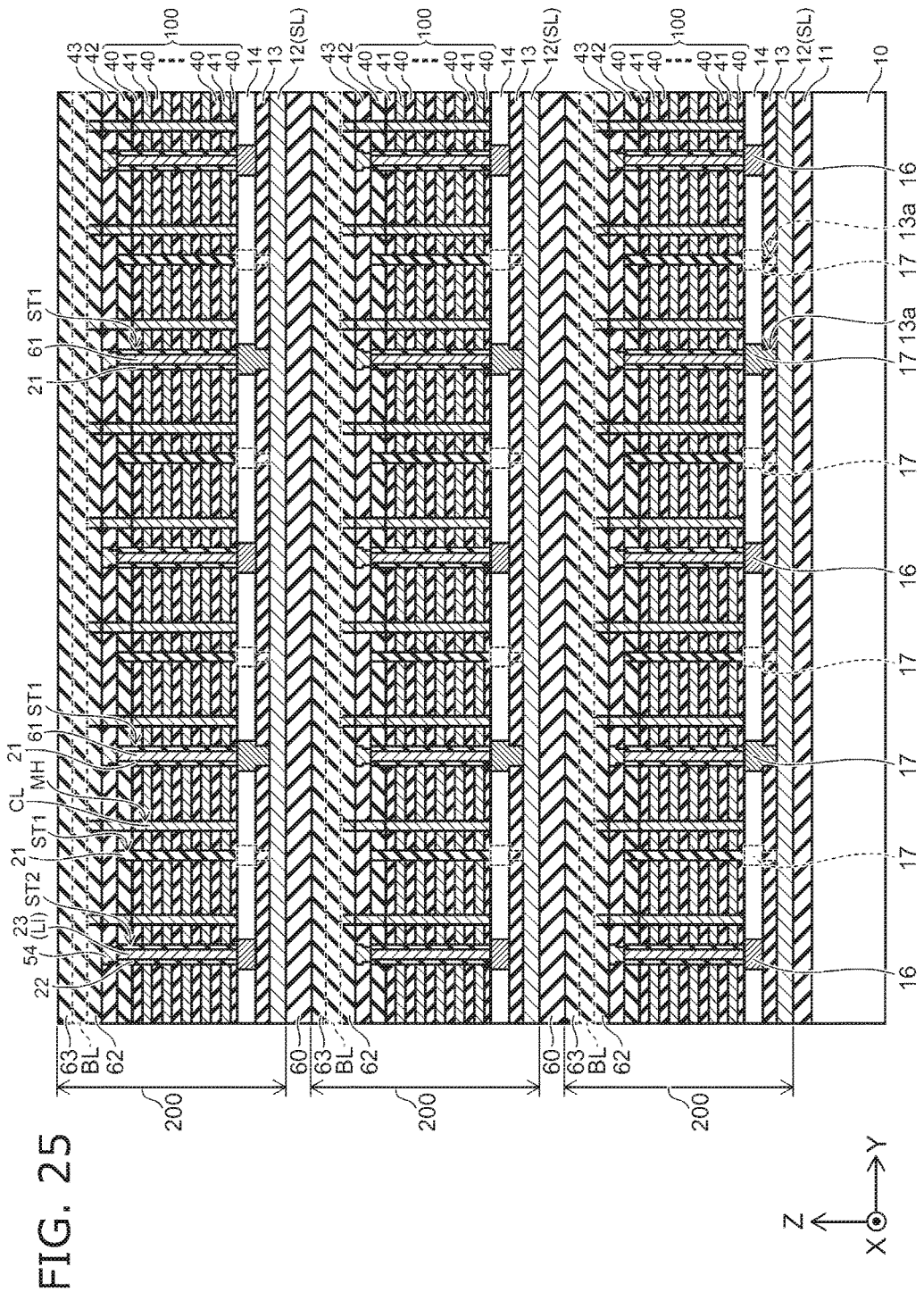
FIG. 25 is a schematic cross-sectional view of a memory cell array in a semiconductor device of a fourth embodiment.

FIG. 25 is a schematic cross-sectional view of a memory cell array 1 in a semiconductor device of a fourth embodiment. The cross-section shown in FIG. 25 corresponds to the cross-sectional view shown in FIG. 3, for example.

As shown in FIG. 25, the fourth embodiment is, for example, different from the first embodiment shown in FIG. 3 as follows:

Structural bodies 200, which includes a bit lines BL and a stacked body 100 including memory holes MH, are stacked in the Z-direction via a ninth insulating film 60 interposed.

At least one of a plurality of first slits ST1 includes a second interconnection 61 therein.

The second interconnection 61 is electrically insulated from the stacked body 100 by a fourth insulating film 21 provided in a first slit ST1. The second interconnection 61 is electrically connected through a second semiconductor region 17 to a first interconnection 12 (a source line SL).

A tenth insulating film 62 is provided on a seventh insulating film 43. The bit line BL is provided on the tenth insulating film 62. The bit line BL is electrically connected to a columnar portion CL provided in a memory hole MH. A eleventh insulating film 63 is provided on the bit line BL. The ninth insulating film 60 is provided on the eleventh insulating film 63. The ninth insulating film 60 is, for example, an insulating substrate. The insulating substrate is, for example, a SiO substrate which includes silicon oxide. A first interconnection 12 (a source line SL) is provided on the ninth insulating film 60.

Figure 26:
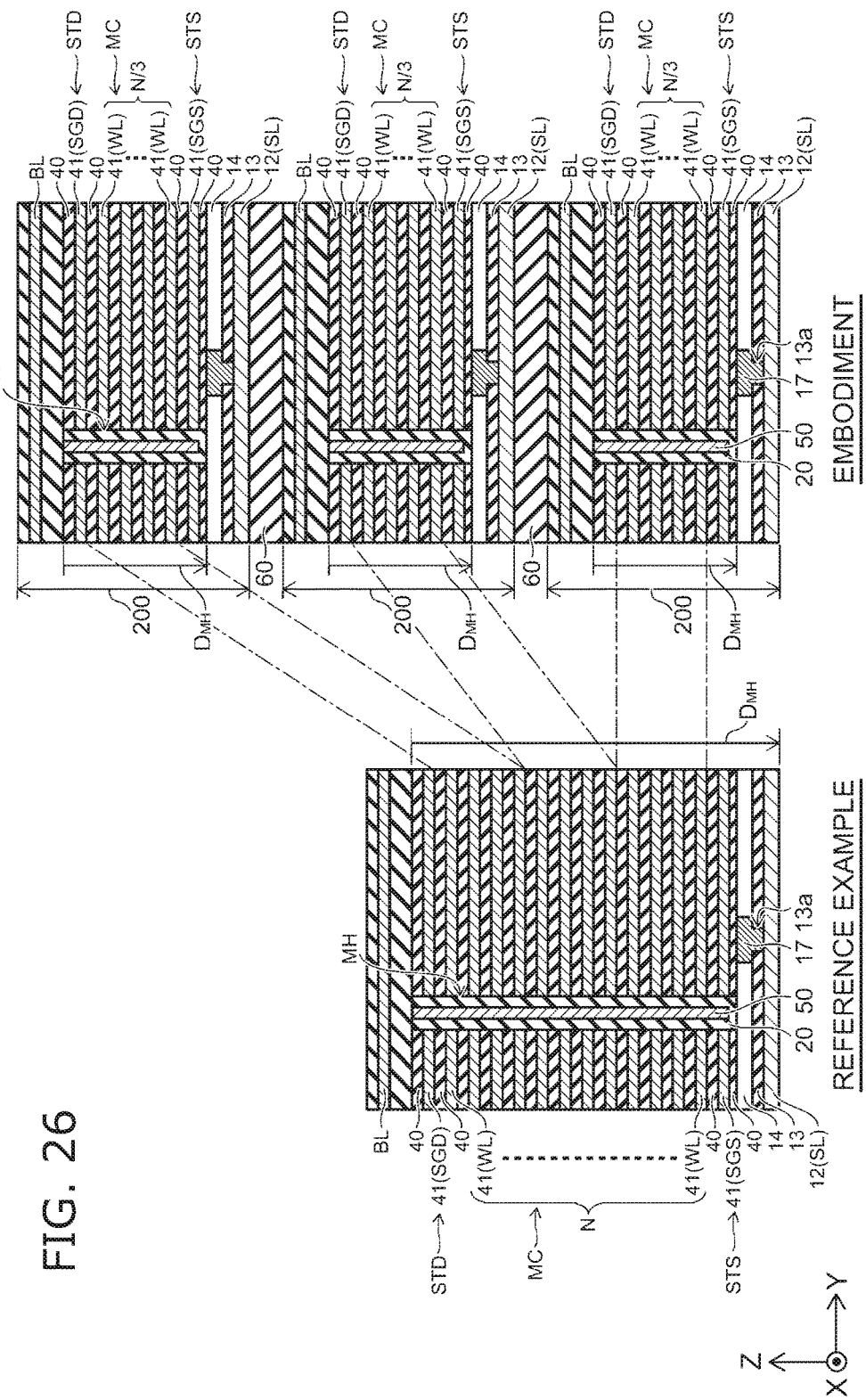
FIG. 26 is a schematic cross-sectional view showing a reference example and the fourth embodiment in comparison.

As mentioned above, in the fourth embodiment, a plurality of structural bodies 200, each of which is included in the semiconductor device of the first or second embodiment, for example, are stacked in the Z-direction. According to the fourth embodiment, it is possible to achieve some advantages as follows:

FIG. 26 is a schematic cross-sectional view showing a reference example and the fourth embodiment in comparison.

According to a requirement for enlarging the memory capacity of the semiconductor device, the stacked number in the stacked body 100 tends to increase. As shown by the "REFERENCE EXAMPLE" in FIG. 26, the stacked number, for example, the number of word lines WL in the stacked body 100 would be increased to be "N". The depth DMH of the memory hole MH becomes larger as the stacked number in the stacked body 100 increases. Thus, it may be more difficult to form the memory hole MH.

Increasing the stacked number makes a number of memory cells enlarged, which are connected in series between the source-side selection transistor STS and the drain-side selection transistor STD. As the number of memory cells MC connected in series increases, a length of the semiconductor body 20 becomes longer. Thus, a channel resistance will also be increased in the memory hole MH.

In contrast, the structural bodies 200 are stacked in the Z-direction in the fourth embodiment. As shown by the "EMBODIMENT" in FIG. 26, three structural bodies 200 would be stacked in the Z-direction, for example. Thereby, it becomes possible to reduce the number of the word lines to be "N/3" in each structural body 200. Thus, the stacked number in each stacked body 100 can be suppressed to be about one third in comparison with the "REFERENCE EXAMPLE".

As mentioned above, in the fourth embodiment, when the stacked number in the stacked body 100 increases, the depth MDH can be suppressed to become larger. Thus, the difficulty in the formation of the memory hole MH can be suppressed to be raised. The length of the semiconductor body 20 also becomes shorter. Accordingly, the channel resistance in the memory hole MH is also suppressed to be increased.

Fifth Embodiment

Figure 27:
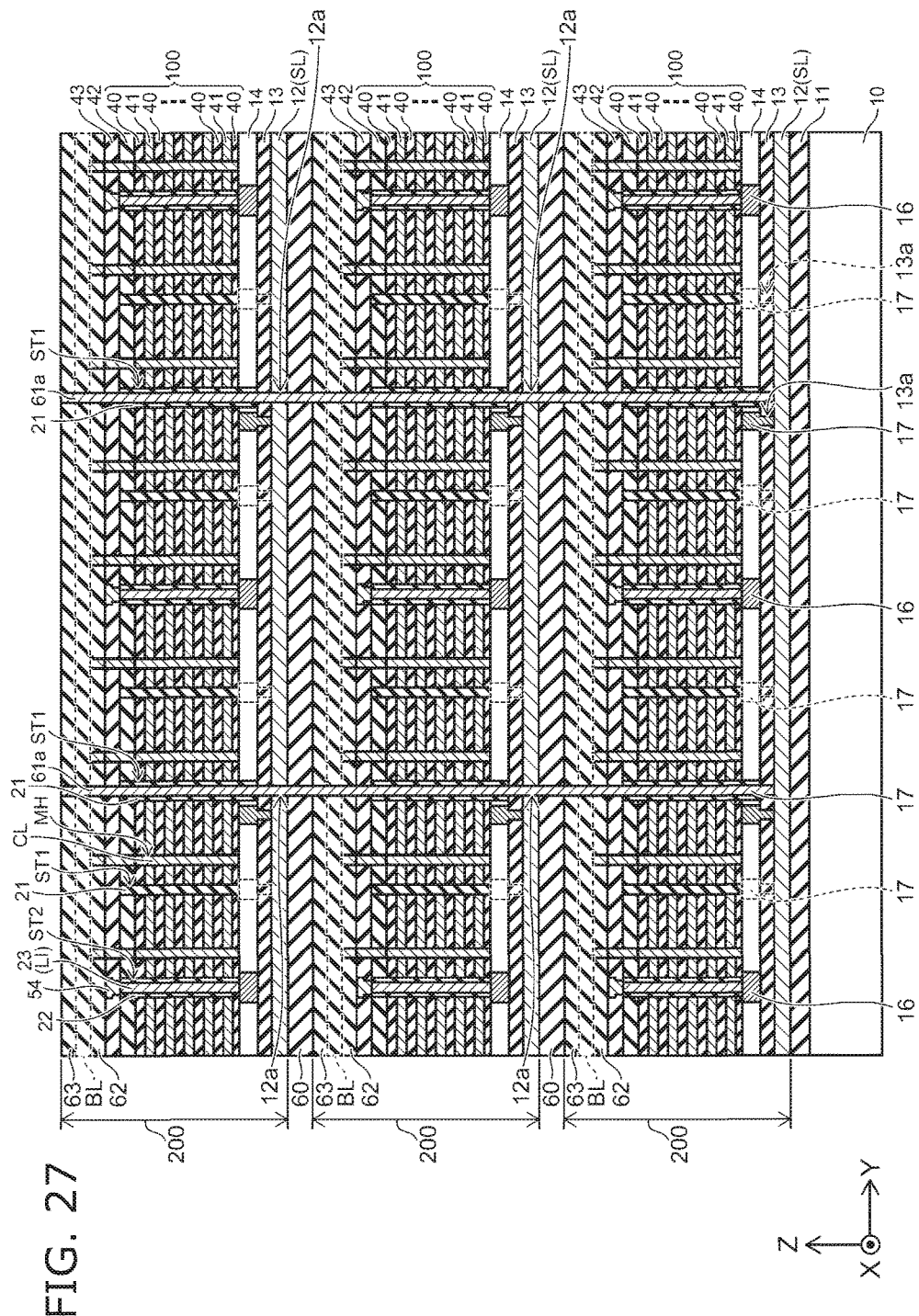
FIG. 27 is a schematic cross-sectional view of a memory cell array in the semiconductor device of the fifth embodiment.

FIG. 27 is a schematic cross-sectional view of a memory cell array 1 in the semiconductor device of the fifth embodiment. The cross-section shown in FIG. 27 corresponds, for example, to the cross-section shown in FIG. 25.

As shown in FIG. 27, the fifth embodiment is, for example, different from the fourth embodiment shown in FIG. 25 as follows:

At least one of a plurality of first slits ST1 includes a second interconnection 61a therein.

The second interconnection 61a is provided so as to extend through a plurality of structural bodies 200 and ninth insulating films 60.

The second interconnection 61a is electrically insulated from a stacked body 100 by a fourth insulating film 21 provided in a slit ST1 as well as the second interconnection 61 of the fourth embodiment. The second interconnection 61a extends through a first interconnection 12 (a source line SL) in a structural body 200. Thus, a through hole 12a is provided in the first interconnection 12 so as to make the second interconnection 61a pass therethrough. A side surface of the first interconnection 12 is exposed at a side surface of the trough hole 12a. The second interconnection 61a is provided in the through hole 12a. The second interconnection 61a provided in the through hole 12a is electrically connected to the first interconnection 12 through the side surface thereof. The second interconnection 61a is electrically connected to each first interconnection 12 of the structural bodies 200 concurrently.

According to such a fifth embodiment, since the structural bodies 200 are stacked in the Z-direction as well as the fourth embodiment, it is possible to achieve the same advantages as the fourth embodiment.

In addition to these advantages, in the fifth embodiment, the second interconnection 61a is provided so as to extend through the structural bodies 200 and the ninth insulating films 20. The second interconnection 61a is electrically connected to each first interconnection 12 concurrently. Such a second interconnection 61a can be formed by the process common to the structural bodies 200 without the necessity of the formation thereof in each of the structural bodies 200. Accordingly, in the semiconductor device of the fifth embodiment, it is possible to achieve the advantages in the reduction of the number of manufacturing steps in comparison with the fourth embodiment, for example.

It should be noted that although the structural bodies 200, each of which is included in the first and second embodiments, are stacked in the Z-direction, a plurality of structural bodies stacked in the Z-direction are not limited thereto. The structural bodies 200 stacked in the Z-direction may be ones each of which includes a stacked body 100 including memory holes MH.

According to the embodiments described above, it is possible to achieve the semiconductor device capable of reducing the in-plane size of the memory cell array in the case where the buried source line is implemented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
   at least one three-dimensional structure including,
   a first interconnection provided on a substrate via a first insulating film interposed,
   a first semiconductor region of a first conductivity type provided on the first interconnection via a second insulating film interposed,
   a stacked body provided on the first semiconductor region, the stacked body including a plurality of third insulating films and a plurality of electrode layers alternately stacked,
   a columnar portion provided in the stacked body, the columnar portion extending in a stacking direction of the stacked body, and including a semiconductor body and a charge storage film, the semiconductor body being in contact with the first semiconductor region,
   a plurality of first insulators provided in the stacked body, the first insulators extending in the stacking direction and a first direction crossing the stacking direction, and being in contact with the first semiconductor region, and
   a plurality of arrays provided in the first semiconductor region, the arrays each including a plurality of second semiconductor regions of a second conductive type, being separated from each other, being provided under the first insulators, being arranged in the first direction, and being electrically connected to the first interconnection.

2. The device according to claim 1, wherein
   the second semiconductor regions are provided along the stacking direction from a bottom end of the first semiconductor region to a top end of the first semiconductor region.

3. The device according to claim 2, wherein
   the first semiconductor region includes
   a first portion, a second portion and a third portion, the first portion being provided between two adjacent second semiconductor regions in the first direction in planar view, and
   the second portion and the third portion spreading on both sides of the first portion in planar view; and
   the second portion is electrically connected to the third portion through the first portion.

4. The device according to claim 1, further comprising:
   a plurality of second insulators provided in the stacked body, and extending in the stacking direction and the first direction, wherein
   each of the second insulators includes a second interconnection therein, and
   the second interconnection is electrically connected to the first semiconductor region.

5. The device according to claim 4, further comprising:
   a third semiconductor region provided in the first semiconductor region, and having first conductivity type impurities of higher concentration than that of the first semiconductor region, wherein
   the second interconnection is electrically connected to the first semiconductor body through the third semiconductor region.

6. The device according to claim 4, wherein
   the second insulators are provided with respect to every two or more first insulators of the plurality of first insulators.

7. The device according to claim 4, wherein
   the second interconnection includes a wall-like conductor, and
   the wall-like conductor extends in the stacking direction and the first direction in the second insulator.

8. The device according to claim 4, wherein
   the second interconnection includes a plurality of columnar conductors, and
   the columnar conductors extend in the stacking direction, and are arranged in the first direction.

9. The device according to claim 8, wherein
   the stacked body includes a staircase provided in an end portion thereof and a plurality of contact portions provided in the staircase, the electrode layers being formed into stairs in the staircase, and the contact portions being electrically connected to the electrode layers; and
   the columnar conductors include the same conductor as conductors included in the contact portions.

10. The device according to claim 4, wherein
    the columnar portion includes a source-side selection transistor, a drain-side selection transistor and a plurality of memory cells, the memory cells being connected in series between one end of a current path at the source-side selection transistor and the other end of the current path at the drain-side selection transistor;
the first interconnection includes a source line electrically connected through the second semiconductor region to the other end of the current path at the source-side selection transistor; and
the second interconnection includes a local interconnection electrically connected through the first semiconductor region to the semiconductor body.

11. The device according to claim 1, comprising:
a plurality of said three-dimensional structures stacked in the stacking direction via a fourth insulating film interposed.

12. The device according to claim 11, wherein
at least one of the first insulator includes a third interconnection, and
the third interconnection is electrically connected through the second interconnection to the first interconnection.

13. The device according to claim 11, wherein
at least one of the first insulator includes a third interconnection, and
the third interconnection is provided so as to extend through the plurality of said three-dimensional structures.

14. The device according to claim 13, wherein
the third interconnection is electrically connected to the first interconnection through a side surface of the first interconnection.

15. A semiconductor device comprising:
a plurality of structural bodies each including:
   a first interconnection;
   a first semiconductor region of a first conductivity type provided on the first interconnection via a first insulating film interposed;
   a stacked body provided on the first semiconductor body, the stacked body including a plurality of second insulating films and a plurality of electrode layers alternately stacked;
   a columnar portion provided in the stacked body, and extending in a stacking direction of the stacked body, the columnar portion including a semiconductor body and a charge storage film that includes a charge storage portion, and being in contact with the first semiconductor region;
   a plurality of first insulators provided in the stacked body, the first insulators extending in the stacking direction and a first direction crossing the stacking direction, and being in contact with the first semiconductor region; and
   a plurality of second semiconductor regions of a second conductivity type provided in the first semiconductor region, the second semiconductor regions being electrically connected to the first interconnection, the structural bodies being stacked via a third insulating film interposed.

16. The device according to claim 15, wherein
at least one of the first insulator includes a second interconnection therein, and
the second interconnection is electrically connected through the second semiconductor region to the first interconnection.

17. The device according to claim 15, wherein
at least one of the first insulators includes a second interconnection therein, and the second interconnection is provided so as to extend through the stacked structural bodies and the third insulating film.

18. The semiconductor device according to claim 17, wherein
the second interconnection is electrically connected to the first interconnection via a side surface of the first interconnection.

19. A method for manufacturing the semiconductor device, the method comprising:
forming a first interconnection on a substrate via a first insulating film;
forming a first semiconductor region of a first conductivity type on the first interconnection via a second insulating film;
forming a stacked body on the first semiconductor region, the stacked body including a plurality of third insulating films and a plurality of sacrifice layers alternately stacked;
forming a staircase in an end portion of the stacked body, the sacrifice layers being formed into stairs in the staircase;
forming a columnar portion in the stacked body, the columnar portion extending in a stacking direction of the stacked body, and including a semiconductor body and a charge storage film, the semiconductor body being in contact with the first semiconductor region;
forming a plurality of first slits and a plurality of second slits in the stacked body, the first slits and the second slits extending in the stacking direction and a first direction crossing the stacking direction;
forming a plurality of second semiconductor regions of a second conductivity type in the first semiconductor region through the first slits, the second semiconductor regions being separated from each other;
replacing the sacrifice layers with a plurality of electrode layers via the first slits and the second slits;
forming first insulators in the first slits and second insulators in the second slits; and
forming a plurality of contact portions in the staircase and a plurality of columnar conductors in the second slits, the contact portions being electrically connected to the electrode layers, and the columnar conductors being electrically connected to the first semiconductor region.

* * * * *